(12) United States Patent
Ashworth et al.

(10) Patent No.: US 11,363,741 B2
(45) Date of Patent: Jun. 14, 2022

(54) SYSTEMS AND METHODS FOR COOLING OF SUPERCONDUCTING POWER TRANSMISSION LINES

(71) Applicant: VEIR, Inc., Boston, MA (US)

(72) Inventors: Stephen Paul Ashworth, Gallicano (IT); Franco Moriconi, Berkeley, CA (US); Timothy David Heidel, Alexandria, VA (US)

(73) Assignee: Veir, Inc., Boston, MA (US)

( * ) Notice: Subject to any disclaimer, the term of this patent is extended or adjusted under 35 U.S.C. 154(b) by 0 days.

(21) Appl. No.: 17/524,262

(22) Filed: Nov. 11, 2021

(65) Prior Publication Data

US 2022/0159873 A1 May 19, 2022

Related U.S. Application Data

(60) Provisional application No. 63/115,226, filed on Nov. 18, 2020.

(51) Int. Cl.
*H05K 7/20* (2006.01)
*H01B 7/42* (2006.01)
*B60H 1/32* (2006.01)

(52) U.S. Cl.
CPC ....... *H05K 7/20309* (2013.01); *B60H 1/3202* (2013.01); *H01B 7/423* (2013.01); *H05K 7/20327* (2013.01); *H05K 7/20381* (2013.01)

(58) Field of Classification Search
CPC ........... H05K 7/20309; H05K 7/20327; H05K 7/20381; H01B 7/423; B60H 1/3202
See application file for complete search history.

(56) References Cited

U.S. PATENT DOCUMENTS 817,389 A 4/1906 Reynolds
3,694,914 A 10/1972 Aupoix et al.
(Continued)

FOREIGN PATENT DOCUMENTS

EP 3051542 A1 8/2016
GB 1499384 A 2/1978
(Continued)

OTHER PUBLICATIONS

Partial Search Report issued for PCT/US2021/058928, dated Feb. 25, 2022.
(Continued)

*Primary Examiner* — Marc E Norman
(74) *Attorney, Agent, or Firm* — Cooley LLP

(57) ABSTRACT

A cooling system includes a coolant transmitter that transmits coolant at a pressure greater than atmospheric pressure. The cooling system also includes an evaporation vessel at atmospheric pressure. The evaporation vessel can contain an amount of coolant at the boiling point of the coolant. The cooling system also includes a pressure reducer fluidically coupled to the coolant transmitter and the evaporation vessel. The pressure reducer can include an orifice. The cooling system is configured such that heat is transferred from the coolant in the coolant transmitter to the coolant contained in the evaporation vessel. An exit stream conduit can fluidically couple the coolant transmitter and the pressure reducer, with the exit stream conduit diverting a portion of the coolant from the coolant transmitter to the evaporation vessel.

36 Claims, 13 Drawing Sheets

(56) References Cited

U.S. PATENT DOCUMENTS

| | | | |
|---|---|---|---|
| 3,723,634 A | 3/1973 | Aupoix et al. | |
| 3,781,455 A | 12/1973 | Hildebrandt | |
| 3,878,691 A | 4/1975 | Asztalos | |
| 3,917,897 A | 11/1975 | Hildebrandt | |
| 3,950,606 A * | 4/1976 | Schmidt | H01B 7/29 |
| | | | 174/15.5 |
| 7,296,419 B2 | 11/2007 | Suzawa et al. | |
| 7,358,435 B2 | 4/2008 | Ladie et al. | |
| 7,453,041 B2 * | 11/2008 | Maguire | H01B 12/16 |
| | | | 174/15.4 |
| 7,598,458 B2 | 10/2009 | Yumura et al. | |
| 7,614,243 B2 | 11/2009 | Masuda et al. | |
| 7,633,014 B2 | 12/2009 | Allais et al. | |
| 7,709,742 B2 | 5/2010 | Allais et al. | |
| 7,840,244 B2 | 11/2010 | Hirose et al. | |
| 7,840,245 B2 | 11/2010 | Hirose | |
| 7,953,466 B2 | 5/2011 | Jang et al. | |
| 7,979,976 B2 | 7/2011 | Soika et al. | |
| 8,091,207 B2 | 1/2012 | Soika et al. | |
| 8,112,135 B2 | 2/2012 | Allais et al. | |
| 8,134,072 B2 | 3/2012 | Allais et al. | |
| 8,214,005 B2 | 7/2012 | Soika et al. | |
| 8,275,430 B2 | 9/2012 | Schmidt et al. | |
| 8,304,650 B2 | 11/2012 | Stemmle et al. | |
| 8,326,386 B2 | 12/2012 | Willen et al. | |
| 8,332,005 B2 | 12/2012 | Schmidt et al. | |
| 8,369,912 B2 | 2/2013 | Usoskin | |
| 8,380,267 B2 | 2/2013 | Soika et al. | |
| 8,401,601 B2 | 3/2013 | Soika et al. | |
| 8,433,381 B2 | 4/2013 | Choi et al. | |
| 8,478,374 B2 | 7/2013 | Maguire et al. | |
| 8,588,877 B2 | 11/2013 | Soika et al. | |
| 8,594,756 B2 | 11/2013 | Roden et al. | |
| 8,623,787 B2 | 1/2014 | Willen et al. | |
| 8,670,808 B2 | 3/2014 | Soika et al. | |
| 8,688,182 B2 | 4/2014 | Soika et al. | |
| 8,748,747 B2 | 6/2014 | Soika et al. | |
| 8,798,697 B2 | 8/2014 | Stemmle et al. | |
| 8,826,674 B2 | 9/2014 | Usoskin | |
| 8,897,845 B2 | 11/2014 | Stemmle et al. | |
| 8,923,940 B2 | 12/2014 | Stemmle et al. | |
| 8,934,951 B2 | 1/2015 | Schmidt et al. | |
| 8,948,831 B2 | 2/2015 | Stemmle et al. | |
| 8,954,126 B2 | 2/2015 | Stemmle et al. | |
| 9,002,423 B2 | 4/2015 | Jang et al. | |
| 9,006,576 B2 | 4/2015 | Stemmle et al. | |
| 9,037,202 B2 | 5/2015 | Yuan et al. | |
| 9,070,497 B2 | 6/2015 | Stemmle et al. | |
| 9,123,459 B2 | 9/2015 | Marzahn et al. | |
| 9,159,473 B2 | 10/2015 | Stemmle et al. | |
| 9,202,611 B2 | 12/2015 | Stemmle et al. | |
| 9,418,777 B2 | 8/2016 | Stemmle et al. | |
| 9,496,072 B2 | 11/2016 | Soika et al. | |
| 9,646,742 B2 | 5/2017 | Yuan et al. | |
| 9,653,196 B2 * | 5/2017 | Yuan | H01L 39/00 |
| 9,685,260 B2 | 6/2017 | Marzahn et al. | |
| 10,062,478 B2 * | 8/2018 | Tamada | H01B 12/16 |
| 10,062,479 B2 | 8/2018 | Stemmle et al. | |
| 10,151,521 B2 | 12/2018 | Schippl et al. | |
| 2005/0079980 A1 | 4/2005 | Mayasuki et al. | |
| 2005/0173149 A1 * | 8/2005 | Gouge | H02G 15/34 |
| | | | 174/125.1 |
| 2006/0150639 A1 * | 7/2006 | Zia | H02G 15/34 |
| | | | 62/50.1 |
| 2009/0192042 A1 | 6/2009 | Kim et al. | |
| 2009/0170706 A1 | 7/2009 | Hirose et al. | |
| 2009/0221426 A1 | 9/2009 | Hazelton | |
| 2009/0254227 A1 | 10/2009 | Tsuda | |
| 2010/0099571 A1 | 4/2010 | Usoskin et al. | |
| 2011/0180293 A1 | 7/2011 | Jang et al. | |
| 2013/0150246 A1 | 6/2013 | Willen et al. | |
| 2013/0165324 A1 | 6/2013 | Jang et al. | |
| 2013/0199821 A1 | 8/2013 | Teng et al. | |
| 2014/0221213 A1 | 8/2014 | Fukuda | |
| 2015/0080225 A1 | 3/2015 | Nomura et al. | |
| 2016/0190788 A1 | 6/2016 | Mitsuhashi et al. | |
| 2016/0351304 A1 | 12/2016 | Schmidt et al. | |
| 2016/0370036 A1 | 12/2016 | Friedhelm | |
| 2017/0352454 A1 | 12/2017 | Na et al. | |
| 2018/0166188 A1 | 6/2018 | Arndt et al. | |
| 2019/0260194 A1 | 8/2019 | Stemmle et al. | |
| 2021/0005355 A1 | 1/2021 | Yamaguchi et al. | |
| 2022/0028583 A1 * | 1/2022 | Alekseev | H02G 15/34 |

FOREIGN PATENT DOCUMENTS

| | | |
|---|---|---|
| WO | WO 2008/018896 A2 | 2/2008 |
| WO | WO 2008/097759 A1 | 8/2008 |
| WO | WO 2008/100702 A2 | 8/2008 |
| WO | WO 2009/120833 A1 | 10/2009 |
| WO | WO 2010/039513 A1 | 4/2010 |
| WO | WO 2014/007903 A2 | 1/2014 |

OTHER PUBLICATIONS

International Search Report and Written Opinion issued for PCT/US2021/058926, dated Feb. 18, 2022.

International Search Report and Written Opinion issued for PCT/US2021/058927, dated Feb. 28, 2022.

Firsov V.P. et al. "Evaporating system for cryogenic support of long length HTS power cables", International Journal of Hydrogen Energy, Science Direct, vol. 43, No. 29, 2018, pp. 13594-13604.

Honjo et al. "Status of Superconducting Cable Demonstration Project in Japan", IEEE Transactions on Applied Superconductivity, vol. 21, No. 3, 2011, pp. 967-971.

International Search Report and Written Opinion issued for PCT/US2021/058928, dated Apr. 20, 2022 (22 pages).

* cited by examiner

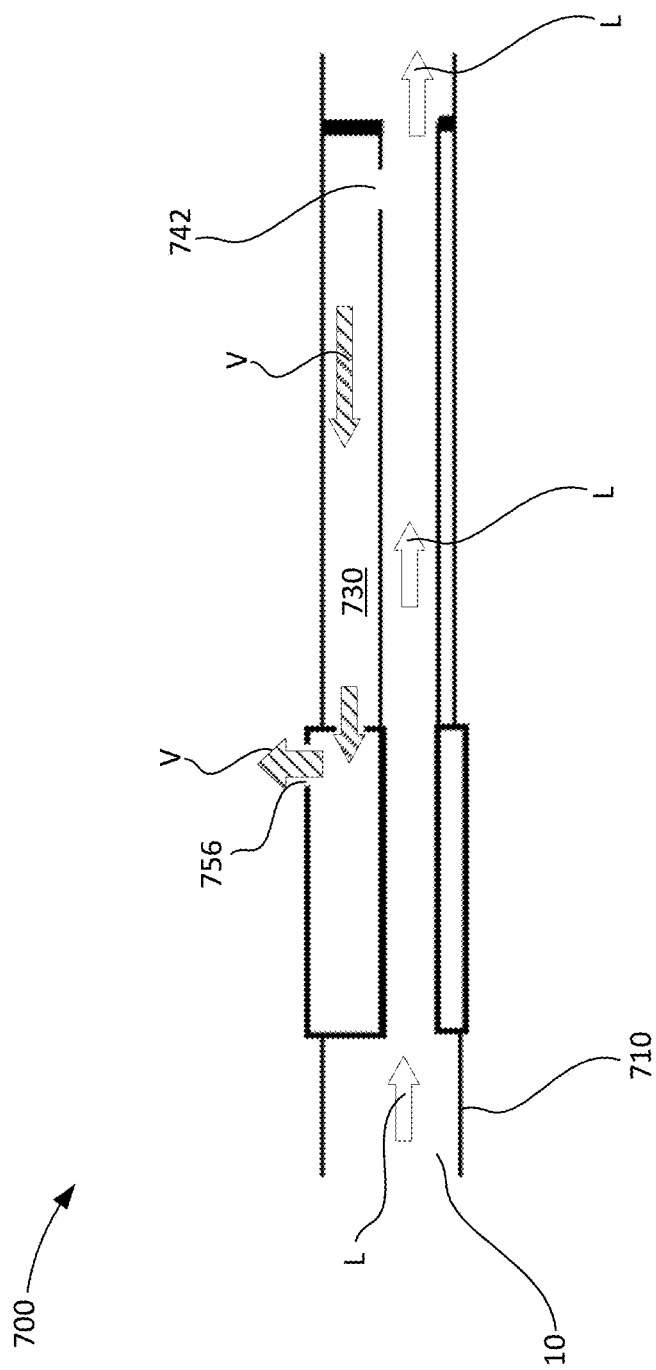

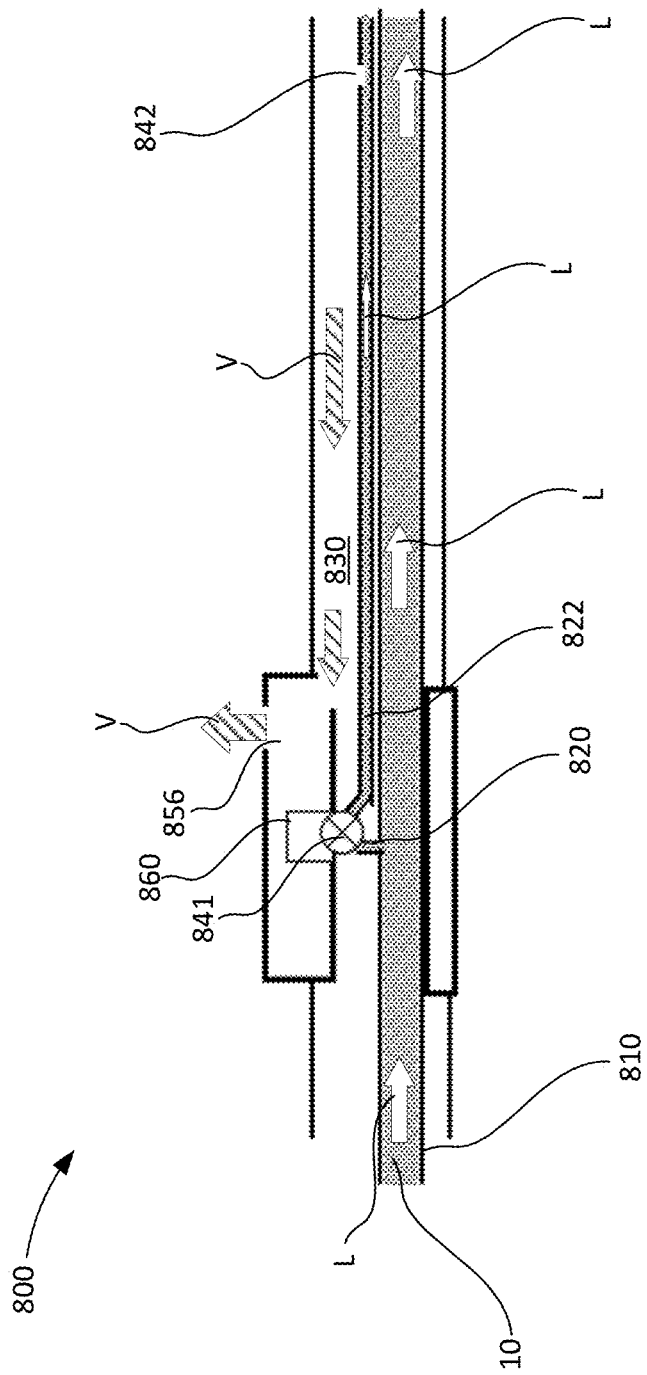

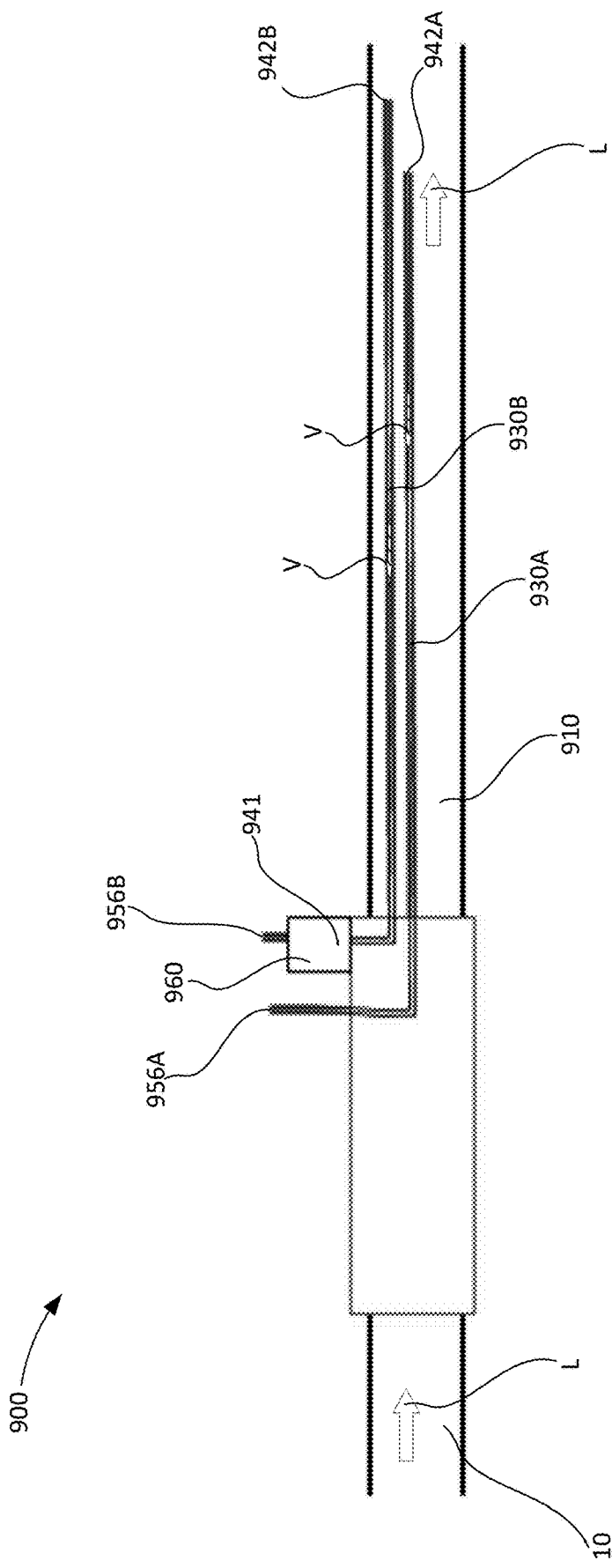

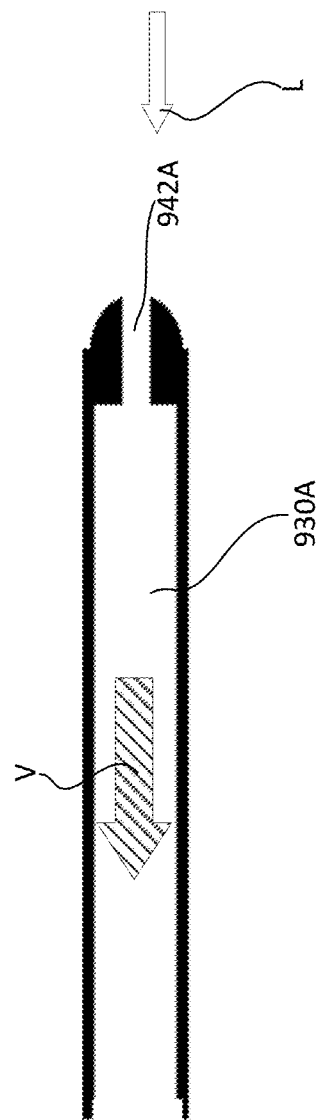

SYSTEMS AND METHODS FOR COOLING OF SUPERCONDUCTING POWER TRANSMISSION LINES

RELATED APPLICATIONS

This application claims priority to and the benefit of U.S. Provisional Patent Application No. 63/115,226, filed Nov. 18, 2020 and titled "Systems and Methods for Cooling of Superconducting Power Transmission Lines," the disclosure of which is hereby incorporated by reference herein in its entirety.

FIELD

The present disclosure is related to the field of electricity transmission, and more specifically, to the cooling of power transmission lines.

BACKGROUND

Electric power is typically moved from its point of generation to consumer loads using an electric power grid ("the grid"). Electric power grids include components such as power generators, transformers, switchgear, transmission and distribution lines, and control and protection devices.

SUMMARY

Embodiments described herein relate to cooling systems and cooling methods, and can be implemented in the cooling of power transmission lines and power transmission systems. In one aspect, a cooling system described herein can include a coolant transmitter that transmits coolant at a pressure greater than atmospheric pressure. The cooling system further includes an evaporation vessel at atmospheric pressure configured to contain an amount of coolant at the boiling point of the coolant. The cooling system further includes a pressure reducer fluidically coupled to the coolant transmitter and the evaporation vessel. The cooling system is configured such that heat is transferred from the coolant in the coolant transmitter to the coolant contained in the evaporation vessel. In some embodiments, an exit stream conduit can fluidically couple the coolant transmitter and the pressure reducer, with the exit stream conduit diverting a portion of the coolant from the coolant transmitter to the evaporation vessel. In some embodiments, the pressure reducer can include an orifice. In some embodiments, the pressure reducer can include a valve. In some embodiments, the pressure reducer can include a throttle. In some embodiments, a level sensor can be disposed in the evaporation vessel. In some embodiments, the coolant can include liquid nitrogen.

BRIEF DESCRIPTION OF THE DRAWINGS

FIG. 7 illustrates a cooling system with a counter current evaporation vessel, according to an embodiment.

FIG. 8 illustrates a cooling system with a counter current evaporation vessel and a header tube, according to an embodiment.

FIGS. 9A-9B illustrate a cooling system with evaporation tubes and details thereof, according to an embodiment.

DETAILED DESCRIPTION

Figure 1:
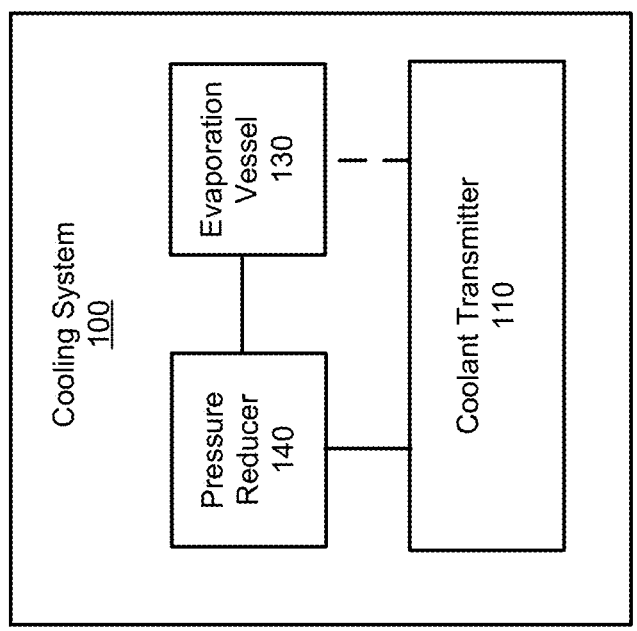
FIG. 1 is a block diagram of an example cooling system, according to an embodiment.

Embodiments described herein relate to cooling systems and cooling methods. In some embodiments, cooling systems and cooling methods described herein can be implemented in the cooling of power transmission systems with superconductor cables. Superconductor cables employed in power transmission systems can operate at up to 10 times the current of conventional wire while maintaining superconductivity. Higher current allows for lower voltage and smaller rights-of-way. Additionally, energy can be transferred through power transmission systems at a higher rate through narrow rights-of-way with reduced energy losses, as contrasted with known systems. Moreover, by incorporating active cooling mechanisms into power transmission systems with superconductors, power transmission lines of the present disclosure can exhibit reduced sag and creep and/or more consistent sag and creep over time (e.g., in the case of overhead power transmission), and generally more consistent performance (for both overhead and underground power transmission) as contrasted with known systems. For example, power transmission lines of the present disclosure may exhibit sag and/or creep that are not variable, or that do not substantially vary, over time, in view of the actively controlled temperature of the power transmission lines.

Known electric power transmission systems use continuous electrical conductors to interconnect power generation stations with consumer loads. Power generation stations, such as thermal (e.g., steam-driven), nuclear, hydroelectric, natural gas, solar and wind power plants, generate electric energy at AC voltages typically ranging between 15 kV and 25 kV. To transport the energy over long distances, the associated voltage is increased at the power generation station, for example via a step-up transformer. Extra-high-voltage (EHV) power transmission lines can transport the energy to geographically remote substations at voltages of 230 kV and above. At intermediate substations, the voltage can be reduced to high-voltage (HV) levels via a step-down transformer, and the energy is transported to HV substations via power transmission lines that operate at voltages ranging from 220 to 110 kV. At HV substations closer to the loads, the voltage is further reduced to 69 kV, and sub-transmission lines connect the HV substations to the many distribution stations. At the distribution substations, the voltage is reduced to a value in the range of 35 kV to 12 kV before being distributed to the loads at 4160/480/240/120V via pole-top or pad-mounted step-down transformers. The precise voltages used in transmission and distribution vary slightly in different regions and different countries.

In the United States, an EHV power transmission line has a nominal voltage of between 230 kV and 800 kV, and a HV power transmission line has a nominal voltage of between 115 kV and 230 kV. For voltages of between 69 kV and 115 kV, the line is considered to be at a sub-transmission level, and below 60 kV it is considered to be at a distribution level. The voltage values demarcating these designations are somewhat arbitrary, and can vary depending on the authority having jurisdiction and/or the location. Known EHV power transmission lines can transport energy as far as 400-500 miles, whereas HV power transmission lines can transport energy as far as 200 miles, and sub-transmission lines can transport energy for 50-60 miles. High-voltage DC (HVDC) power transmission lines are used to transmit energy over long distances or underwater. In a HVDC system, AC voltage generated by a generator is rectified, and the energy is transmitted via a DC cable to the receiving station, where an inverter is used to convert DC voltage back to AC.

Superconducting materials have zero or near-zero electrical resistivity when cooled below their critical temperature. Superconducting materials presently available as wires or tapes have critical temperatures below approximately −150° C. (123 K). Some underground cables include superconducting materials cooled by flowing liquid nitrogen (LN) at temperatures below −196° C. (77 K) and enclosed in a thermally insulating jacket ("TIJ"). Superconducting cables have very low energy losses due to resistance if multiple superconducting wires are joined. Superconducting cables generate some energy losses in superconductors when carrying AC currents ("AC losses"), some energy losses due to changing magnetic fields ("magnetic losses") and have some heat leak through the TIJ. Superconducting cables carrying DC current have smaller losses, dominated by the heat leak through the TIJ. Heat generated by energy losses and leaking into the cooled region can be removed by a coolant to maintain the superconductor within its operating temperature range.

In known superconducting transmission deployments, coolant typically enters the cable as a sub-cooled liquid, for example at a temperature of 68 K and at a pressure of 20 bar. The energy losses generate heat within the TIJ and the heat can be removed by the flowing of coolant. The temperature of the coolant therefore increases as it flows along the cable due to this heat energy. The temperature increase depends on the heat energy (W/m), the flow rate (kg/s) of the coolant, the length of cable (m), and the specific heat capacity of the coolant (J/kg-K). The flowing coolant has a maximum allowable temperature. This maximum allowable temperature has limited the length of superconducting cables deployed.

As used herein, "subcooled liquid" refers to a liquid that is at a temperature lower than its boiling point at a given pressure. For example, at atmospheric pressure (i.e., 760 mmHg), the boiling point of nitrogen is about 77.4 K. Thus, nitrogen would be a subcooled liquid at atmospheric pressure and a temperature of 70 K. At 20 bar absolute, the boiling point of nitrogen is about 115 K. Thus, nitrogen is a subcooled liquid at a pressure of 20 bar absolute and a temperature of 77.4 K (its boiling point at atmospheric pressure).

As an example, if 1 kg/s of LN can flow into a cable at 68 K. This subcooled LN is produced by cooling LN from storage (or from previous use in the cable). If 5 W/m of heat is to be removed, the LN will warm by 1 K every 400 m. If an upper temperature limit of 75 K is permissible (e.g., given a heat capacity of 2 J/gK for LN, or 1 J/gK for liquid natural gas), the cable section length is limited to 2.8 km. At this point, the LN must be re-cooled to 68 K. Note that once in the cable the LN does not boil. In some cases, cooling can utilize latent heat and no specific heat. LN boils under atmospheric pressure at 77.4 K, so cooling to near 77.4 K is relatively straightforward using an evaporator open to atmospheric pressure. The equipment for cooling 1 kg/s of LN below 77.4 K is significant. The equipment for re-cooling (placed every 2.8 km in the example above) is similar in complexity to the equipment for initial cooling of LN before entry into the power line. This may be accomplished by maintaining a reduced pressure of a boiling pool of LN using pumps, or by mechanical refrigeration.

Both of the above mentioned methods have significant drawbacks. First, there are many moving parts, and reliability is important for each of them in operation of a power grid. This can often entail multiple redundant circuits. Capital cost of the cooling equipment, the site (about 50 m² or more may be desirable), and access rights to the site are also drawbacks. Additionally, operating cost can be substantial. Refrigeration systems consume a large amount of electrical power (on the order of 100 kW and above). The power needed for cooling increases with the power transmitted. Power transmission is typically at its highest when electrical power is in short supply and energy is most expensive. Complex systems also need periodic maintenance, which can add to the operating costs.

Transmission lines are often used to transport electricity over long distances. High voltage, high power transmission lines may be hundreds of km long and pass through remote areas. Placing a re-cooling station every few km is generally not practical or economic. There may be no suitable power source, noting that transmitted power may not be readily available to operate the cooling system. The voltage of the transmitted power can be too high or DC. Access for maintenance can be difficult, and the overall system reliability may be low due to multiple units in series, siting and land area may be a problem and capital expense can be high.

The shortcomings of the cooling systems described above have been overcome in demonstration systems, but have placed significant impediments to the wider deployment of superconducting power cables in the electricity grid. It is therefore desirable to have a cooling system that overcomes these problems.

According to some embodiments described herein, a coolant can enter an underground or overhead cable of a transmission line at the approximate atmospheric boiling point of the coolant (i.e., the approximate boiling point of the coolant at atmospheric pressure) while being held at a pressure greater than atmospheric pressure. In other words, the coolant can be a subcooled liquid. Embodiments described herein include re-cooling by allowing a portion of the coolant to escape the higher pressure flow system and enter an evaporation vessel venting to the atmosphere. The coolant at atmospheric pressure accumulates in the evaporation vessel, boils, and maintains a temperature near the atmospheric boiling point of the coolant. For example, LN would boil at about 77.4 K in atmospheric pressure (near sea level). Heat from the subcooled high-pressure coolant can then transfer to the boiling coolant via a heat exchanger or a heat exchange interface. This heat transfer can be via conduction and/or a forced convection mechanism.

Advantages of such a system allow for cooling without the use of refrigeration units and lower capital costs. In some embodiments, a cooling system can be operated without external power input. In some embodiments, systems can be placed at high voltage and supported off of a support tower by dielectric insulators. In some embodiments, the cooling system can use local external power harvested inductively from a high voltage power conductor or delivered to the station from an external power source. As an example, the external power source can include a local photovoltaic or thermoelectric energy generation device. In some embodiments, control power can be delivered to the cooling system wirelessly. Reduced complexity in relation to systems with refrigeration allows for more units to be placed along a power transmission line. Embodiments described herein can be used in tandem with systems described in U.S. provisional patent application No. 63/115,140, titled "Suspended Superconducting Transmission Lines," filed Nov. 18, 2020 ("the '140 application"), which is hereby incorporated by reference in its entirety. Although functional elements are listed separately herein, it may be advantageous to combine two or more functions into one element. For example, in some embodiments, a cooling system can include a TIJ and a region vented to atmospheric pressure to boil coolant.

In some embodiments, LN enters a cable near 77.4 K and pressures above 1 atmosphere. The LN is therefore sub-cooled and not boiling. In some embodiments, the LN entering the cable can be pressurized either by pump or by industry standard vaporizer. The entry and exit pressures determine the flow rate of liquid, or the flow rate from the pump determines the entry pressure. Cooling of the inflowing LN to near 77.4 K is achieved by passing the LN through a heat exchanger immersed in a separate bath of boiling LN venting to the atmosphere. In some embodiments, the system for providing LN at the required pressure, flow rate and temperature is termed a 'conditioning unit'.

The flowing, subcooled LN warms as it travels along the cable. The allowed temperature rise is typically smaller (2 K) than in existing state of art (7 K) and it remains sub-cooled. Consequently, after some distance (typically between 200 m and 1 km) a re-cooling of the subcooled LN is desired, typically from 79K to 77K.

In some embodiments, the remaining high pressure subcooled, but "warm," flowing LN passes through a heat exchanger cooled by the boiling LN. In some embodiments, the amount of LN flowing into the evaporation vessel can be controlled to maintain a liquid level sufficient to submerge the heat exchanger but not so as to overflow. Heat from the 'warm' LN flow is transferred to the heat exchanger by forced convective heat transfer, and the form and surface of the heat exchanger may be optimized as well known in the art. The heat is then transferred to the boiling LN by boiling heat transfer and the form and surface of the heat exchanger exposed to boiling LN may be optimized for boiling heat transfer as well known in the art.

In some embodiments, the cold side of the heat exchanger cannot be at a temperature below the boiling temperature of LN under atmospheric pressure. As a consequence, the temperature of the flowing LN, and hence the operating temperature of the superconductor, is typically above the boiling point of LN at atmospheric pressure. This is in contrast to previously implemented cooling schemes. Consequently, more re-cooling stations may be desired for a given power line length. However, with strategic re-cooling station spacing and acceptable inlet pressure, power lines over 100 km long can be constructed with a single LN supply point.

At each re-cooling station, a fraction of the flowing LN is removed from the flow to cool the remainder. Consequently, the mass flow rate decreases along the cable.

FIG. 1 is a block diagram showing components of a cooling system 100, according to an embodiment. The cooling system 100 includes a coolant transmitter 110, an evaporation vessel 130, and a pressure reducer 140. The solid lines indicate fluidic couplings, while the dotted line indicates an optional fluidic coupling. More specifically, fluid can flow directly between the coolant transmitter 110 and the pressure reducer 140, and fluid can flow directly between the evaporation vessel 130 and the pressure reducer 140. In some embodiments, fluid can flow directly between the evaporation vessel 130 and the coolant transmitter 110. In some embodiments, there is no fluidic coupling at an interface between the evaporation vessel 130 and the coolant transmitter 110 (i.e., no fluidic coupling at an interface without the pressure reducer 140 as an intermediary). In other words, while the evaporation vessel 130 would be fluidically coupled to the coolant transmitter 110 via the pressure reducer 140, there would be no direct fluidic coupling at an interface between the coolant transmitter 110 and the evaporation vessel 130. An example of such a situation is if the coolant transmitter includes a shell and tube heat exchanger, and fluid flows on the tube side through the evaporation vessel 130 while fluid flows on the shell side through the coolant transmitter 110. The coolant transmitter 110 is directly fluidically coupled to the pressure reducer 140 and the evaporation vessel 130 is directly fluidically coupled to the coolant transmitter 110. A coolant flows through the cooling system 100 and the components thereof. In some embodiments, the coolant can include LN, liquid helium, liquid neon, liquid air, or any combination thereof.

In use, the coolant flows through the cooling system 100 via the coolant transmitter 110 at a pressure greater than atmospheric pressure. In the coolant transmitter 110, the coolant is subcooled and not boiling, but warmer than the boiling point of the coolant at atmospheric pressure (also referred to herein as "atmospheric boiling point"). A portion of the coolant is diverted away from the coolant transmitter 110 and enters the evaporation vessel 130 via the pressure reducer 140. In the evaporation vessel 130, the coolant can be exposed to atmospheric or near atmospheric pressure, where the coolant boils while maintaining a temperature at the atmospheric boiling point or near the atmospheric boiling point of the coolant. Heat is then transferred from the boiling coolant in the evaporation vessel 130 to the subcooled liquid coolant in the coolant transmitter 110. The subcooled liquid coolant in the coolant transmitter 110 is cooled to the atmospheric boiling point or near the atmospheric boiling point of the coolant.

In some embodiments, multiple cooling systems 100 can be placed along a length of a power transmission line at regular or irregular intervals. In some embodiments, the intervals can be at least about 200 m, at least about 300 m, at least about 400 m, at least about 500 m, at least about 600 m, at least about 700 m, at least about 800 m, at least about 900 m, at least about 1 km, at least about 1.5 km, at least about 2 km, at least about 2.5 km, at least about 3 km, at least about 3.5 km, at least about 4 km, or at least about 4.5 km. In some embodiments, the intervals can be no more than about 5 km, no more than about 4.5 km, no more than about 4 km, no more than about 3.5 km, no more than about 3 km, no more than about 2.5 km, no more than about 2 km, no more than about 1.5 km, no more than about 1 km, no more than about 900 m, no more than about 800 m, no more than about 700 m, no more than about 600 m, no more than about 500 m, no more than about 400 m, or no more than about 300 m. Combinations of the above-reference intervals for placement of the cooling systems 100 are also possible (e.g., at least about 200 m and no more than about 5 km or at least about 500 m and no more than about 1 km), inclusive of all values and ranges therebetween. In some embodiments, the intervals can be about 200 m, about 300 m, about 400 m, about 500 m, about 600 m, about 700 m, about 800 m, about 900 m, about 1 km, about 1.5 km, about 2 km, about 2.5 km, about 3 km, about 3.5 km, about 4 km, about 4.5 km, or about 5 km.

In some embodiments, the coolant transmitter 110 can include a layer of insulation (e.g., a TIJ). In some embodiments, the evaporation vessel 130 can include a layer of insulation. In some embodiments, the pressure reducer 140 can include a layer of insulation.

The mass flow rate of coolant into the cooling system 100 (i.e., via the coolant transmitter 110) depends on the allowed temperature rise in a section (i.e., interval) of the power transmission line, the heat to be removed in each section, and the length of the section, and the specific heat capacity of the coolant. Equation (1) below summarizes this relationship.

$$M_{in} = \frac{QL}{\Delta TC} \quad (1)$$

Where:
$M_{in}$ is the mass flow rate of coolant (kg/s)
Q is the amount of heat to be removed in each section (W/m)
L is the length of a section (m)
$\Delta T$ is the allowed temperature rise in a section (K)
C is the specific heat capacity of the coolant (J/kg-K)

Coolant can flow through the evaporation vessel 130. If the evaporation vessel 130 is vented to atmospheric pressure, the temperature of the evaporation vessel 130 will be maintained at the local boiling point of the coolant (e.g., 77.4 K for LN at sea level). In some embodiments, the liquid level in the evaporation vessel 130 can be maintained by allowing some of the coolant to flow from the coolant transmitter 110 to the evaporation vessel 130 via an exit stream conduit (not shown). The exit stream conduit can include an intermediary stream between the coolant transmitter 110 and the pressure reducer 140. A fraction of the coolant running through the coolant transmitter 110 is diverted to the evaporation vessel 130 (e.g., via the exit stream conduit and the pressure reducer 140).

The fraction of coolant that flows through the coolant transmitter 110 that is diverted to the evaporation vessel 130 can be calculated according to:

$$f = \frac{dM}{M_{in}} = \frac{\Delta TC}{\gamma}, \quad (2)$$

where:
f is the fraction of coolant flowing through the coolant transmitter 110 that is diverted to the evaporation vessel 130
$M_{in}$ is the mass flow rate of coolant (kg/s), as calculated in Equation (1)
$\Delta T$ is the temperature decrease to be achieved in the transfer of heat from the coolant in the evaporation vessel 130 to the coolant in the coolant transmitter 110 (K).
$\gamma$ is the latent heat of boiling (J/kg)
C is the specific heat capacity of the coolant (J/kg-K)

In some embodiments, $\Delta T$ can be the same or substantially similar to $\Delta T$ calculated in Equation (1). In other words, the cooling achieved in transferring heat from the evaporation vessel 130 to the coolant transmitter 110 can offset the temperature increase allowed in a section of the coolant transmitter 110.

In some embodiments, the weight percentage of coolant that is diverted from the coolant transmitter 110 to the evaporation vessel 130 can be at least about 0.5 wt %, at least about 1 wt %, at least about 1.5 wt %, at least about 2 wt %, at least about 2.5 wt %, at least about 3 wt %, at least about 3.5 wt %, at least about 4 wt %, at least about 4.5 wt %, at least about 5 wt %, at least about 5.5 wt %, at least about 6 wt %, at least about 6.5 wt %, at least about 7 wt %, at least about 7.5 wt %, at least about 8 wt %, at least about 8.5 wt %, at least about 9 wt %, or at least about 9.5 wt %. In some embodiments, the weight percentage of coolant that is diverted from the coolant transmitter 110 to the evaporation vessel 130 can be no more than about 10 wt %, no more than about 9.5 wt %, no more than about 9 wt %, no more than about 8.5 wt %, no more than about 8 wt %, no more than about 7.5 wt %, no more than about 7 wt %, no more than about 6.5 wt %, no more than about 6 wt %, no more than about 5.5 wt %, no more than about 5 wt %, no more than about 4.5 wt %, no more than about 4 wt %, no more than about 3.5 wt %, no more than about 3 wt %, no more than about 2.5 wt %, no more than about 2 wt %, no more than about 1.5 wt %, or no more than about 1 wt %. Combinations of the above-referenced ranges for the weight percentage of coolant diverted from the coolant transmitter 110 to the evaporation vessel 130 are also possible (e.g., at least about 0.5 wt % and no more than about 10 wt % or at least about 1 wt % and no more than about 5 wt %), inclusive of all values and ranges therebetween. In some embodiments, the weight percentage of coolant that is diverted from the coolant transmitter 110 to the evaporation vessel 130 can be about 0.5 wt %, about 1 wt %, about 1.5 wt %, about 2 wt %, about 2.5 wt %, about 3 wt %, about 3.5 wt %, about 4 wt %, about 4.5 wt %, about 5 wt %, about 5.5 wt %, about 6 wt %, about 6.5 wt %, about 7 wt %, about 7.5 wt %, about 8 wt %, about 8.5 wt %, about 9 wt %, about 9.5 wt %, or about 10 wt %.

In some embodiments, coolant can be diverted from the coolant transmitter 110 to the evaporation vessel 130 at a rate of at least about 0.1 L/min, at least about 0.2 L/min, at least about 0.3 L/min, at least about 0.4 L/min, at least about 0.5 L/min, at least about 0.6 L/min, at least about 0.7 L/min, at least about 0.8 L/min, at least about 0.9 L/min, at least about 1 L/min, at least about 2 L/min, at least about 3 L/min, at least about 4 L/min, at least about 5 L/min, at least about 6 L/min, at least about 7 L/min, at least about 8 L/min, or at least about 9 L/min, or about 10 L/min. In some embodiments, coolant can be diverted from the coolant transmitter 110 to the evaporation vessel 130 at a rate no more than about 10 L/min, no more than about 9 L/min, no more than about 8 L/min, no more than about 7 L/min, no more than about 6 L/min, no more than about 5 L/min, no more than about 4 L/min, no more than about 3 L/min, no more than about 2 L/min, no more than about 1 L/min, no more than about 0.9 L/min, no more than about 0.8 L/min, no more than about 0.7 L/min, no more than about 0.6 L/min, no more than about 0.5 L/min, no more than about 0.4 L/min, no more than about 0.3 L/min, or no more than about 0.2 L/min. Combinations of the above-referenced ranges for the amount of coolant diverted from the coolant transmitter 110 to the evaporation vessel 130 are also possible (e.g., at least about 0.1 L/min and no more than about 10 L/min or at least about 1 L/min and no more than about 5 L/min), inclusive of all values and ranges therebetween. In some embodiments, coolant can be diverted from the coolant transmitter 110 to the evaporation vessel 130 at a rate of about 0.1 L/min, about 0.2 L/min, about 0.3 L/min, about 0.4 L/min, about 0.5 L/min, about 0.6 L/min, about 0.7 L/min, about 0.8

L/min, about 0.9 L/min, about 1 L/min, about 2 L/min, about 3 L/min, about 4 L/min, about 5 L/min, about 6 L/min, about 7 L/min, about 8 L/min, about 9 L/min, or about 10 L/min. In some embodiments, the flow rate of coolant to the evaporation vessel 130 and/or the fraction of coolant diverted from the coolant transmitter 110 to the evaporation vessel 130 and/or the liquid coolant level can be controlled by a level sensor (not shown) disposed in the evaporation vessel 130.

In some embodiments, the coolant transmitter 110 can be maintained at a gauge pressure of at least about 1 bar, at least about 2 bar, at least about 3 bar, at least about 4 bar, at least about 5 bar, at least about 6 bar, at least about 7 bar, at least about 8 bar, at least about 9 bar, at least about 10 bar, at least about 15 bar, at least about 20 bar, at least about 25 bar, at least about 30 bar, at least about 35 bar, at least about 40 bar, or at least about 45 bar. In some embodiments, the coolant transmitter 110 can be maintained at a gauge pressure of no more than about 50 bar, no more than about 45 bar, no more than about 40 bar, no more than about 35 bar, no more than about 30 bar, no more than about 25 bar, no more than about 20 bar, no more than about 15 bar, no more than about 10 bar, no more than about 9 bar, no more than about 8 bar, no more than about 7 bar, no more than about 6 bar, no more than about 5 bar, no more than about 4 bar, no more than about 3 bar, or no more than about 2 bar. Combinations of the above-referenced gauge pressures in the coolant transmitter 110 are also possible (e.g., at least about 1 bar and no more than about 50 bar or at least about 10 bar and no more than about 30 bar), inclusive of all values and ranges therebetween. In some embodiments, the coolant transmitter 110 can be maintained at a gauge pressure of about 1 bar, about 1 bar, about 2 bar, about 3 bar, about 4 bar, about 5 bar, about 6 bar, about 7 bar, about 8 bar, about 9 bar, about 10 bar, about 15 bar, about 20 bar, about 25 bar, about 30 bar, about 35 bar, about 40 bar, about 45 bar, or about 50 bar. In some embodiments, the pressure in the coolant transmitter 110 can be maintained via a pump, a booster pump, a compressor, a centrifugal pump, or any combination thereof.

In some embodiments, the cooling system 100 can limit the increase in temperature of the coolant in the coolant transmitter 110 (i.e., ΔT from Equation (1) above) to no more than about 10 K, no more than about 9 K, no more than about 8 K, no more than about 7 K, no more than about 6 K, no more than about 5 K, no more than about 4 K, no more than about 3 K, no more than about 2 K, no more than about 1 K, no more than about 0.9 K, no more than about 0.8 K, no more than about 0.7 K, no more than about 0.6 K, no more than about 0.5 K, no more than about 0.4 K, no more than about 0.3 K, no more than about 0.2 K, or no more than about 0.1 K, inclusive of all values and ranges therebetween.

In some embodiments, the cooling system 100 can limit the temperature of the coolant in the coolant transmitter 110 to be no more than about 10 K, no more than about 9 K, no more than about 8 K, no more than about 7 K, no more than about 6 K, no more than about 5 K, no more than about 4 K, no more than about 3 K, no more than about 2 K, no more than about 1 K, no more than about 0.9 K, no more than about 0.8 K, no more than about 0.7 K, no more than about 0.6 K, no more than about 0.5 K, no more than about 0.4 K, no more than about 0.3 K, no more than about 0.2 K, or no more than about 0.1 K greater than the atmospheric (i.e., at 760 mmHg) boiling point of the coolant, inclusive of all values and ranges therebetween.

In some embodiments, the evaporation vessel 130 can be vented to atmospheric pressure. In some embodiments, the evaporation vessel 130 can be maintained at or near atmospheric pressure. In some embodiments, the evaporation vessel 130 can be maintained at a pressure lower than the pressure of the coolant transmitter 110. In some embodiments, the evaporation vessel 130 can be maintained at a pressure lower than the pressure of the coolant transmitter 110 by at least about 1 bar, at least about 2 bar, at least about 3 bar, at least about 4 bar, at least about 5 bar, at least about 6 bar, at least about 7 bar, at least about 8 bar, at least about 9 bar, at least about 10 bar, at least about 15 bar, at least about 20 bar, at least about 25 bar, at least about 30 bar, at least about 35 bar, at least about 40 bar, or at least about 45 bar. In some embodiments, the evaporation vessel 130 can be maintained at a pressure lower than the pressure of the coolant transmitter 110 by no more than about 50 bar, no more than about 45 bar, no more than about 40 bar, no more than about 35 bar, no more than about 30 bar, no more than about 25 bar, no more than about 20 bar, no more than about 15 bar, no more than about 10 bar, no more than about 9 bar, no more than about 8 bar, no more than about 7 bar, no more than about 6 bar, no more than about 5 bar, no more than about 4 bar, no more than about 3 bar, or no more than about 2 bar. Combinations of the above referenced differences between the pressure of the evaporation vessel 130 and the coolant transmitter 110 are also possible (e.g., at least about 1 bar and no more than about 50 bar or at least about 15 bar and no more than about 25 bar), inclusive of all values and ranges therebetween. In some embodiments, the evaporation vessel 130 can be maintained at a pressure lower than the pressure of the coolant transmitter 110 by about 1 bar, about 2 bar, about 3 bar, about 4 bar, about 5 bar, about 6 bar, about 7 bar, about 8 bar, about 9 bar, about 10 bar, about 15 bar, about 20 bar, about 25 bar, about 30 bar, about 35 bar, about 40 bar, about 45 bar, or about 50 bar.

In some embodiments, the evaporation vessel 130 can include a heat exchanger (not shown). For example, the evaporation vessel 130 can include one or more tubes that act as a tube side of a shell and tube heat exchanger, while the coolant transmitter 110 can include a portion that acts as a shell running along the outside of the tubes in the evaporation vessel 130. In some embodiments, the evaporation vessel 130 can be a heat exchanger. In some embodiments, the evaporation vessel 130 can be a spiral tube heat exchanger. In some embodiments, the evaporation vessel 130 can be contained inside the coolant transmitter 110.

In some embodiments, the cooling system 100 can include a heat exchanger at an interface between the evaporation vessel 130 and the coolant transmitter 110. Coolant can circulate between the coolant transmitter 110 and the heat exchanger on a first side of the heat exchanger, and coolant can flow between the evaporation vessel 130 and the heat exchanger on a second side of the heat exchanger. In some embodiments, the first side of the heat exchanger can be a shell side. In some embodiments, the first side of the heat exchanger can be a tube side. In some embodiments, the second side of the heat exchanger can be a shell side. In some embodiments, the second side of the heat exchanger can be a tube side. In some embodiments, the heat exchanger can be a plate-fin heat exchanger. In some embodiments, the evaporation vessel 130 can be enclosed in a TIJ to prevent boil-off of coolant.

Coolant flows from the coolant transmitter 110 to the evaporation vessel 130 via the pressure reducer 140. In some embodiments, the coolant can flow from the coolant transmitter 110 to the evaporation vessel 130 via multiple conduits. In some embodiments, the coolant can flow from the coolant transmitter 110 to the evaporation vessel 130 via 1, 2, 3, 4, 5, 6, 7, 8, 9, 10 or more conduits. In some embodiments, the pressure reducer 140 can include an orifice. In some embodiments, the pressure reducer 140 can include multiple orifices. In some embodiments, the pressure reducer 140 can include a throttle. In some embodiments, the pressure reducer 140 can include a valve. In some embodiments, the pressure reducer 140 can include multiple valves.

In some embodiments, the pressure reducer 140 can maintain a pressure difference between the coolant transmitter 110 and the evaporation vessel 130 of at least about 1 bar, at least about 2 bar, at least about 3 bar, at least about 4 bar, at least about 5 bar, at least about 6 bar, at least about 7 bar, at least about 8 bar, at least about 9 bar, at least about 10 bar, at least about 15 bar, at least about 20 bar, at least about 25 bar, at least about 30 bar, at least about 35 bar, at least about 40 bar, or at least about 45 bar. In some embodiments, the pressure reducer 140 can maintain a pressure difference between the coolant transmitter 110 and the evaporation vessel 130 of no more than about 50 bar, no more than about 45 bar, no more than about 40 bar, no more than about 35 bar, no more than about 30 bar, no more than about 25 bar, no more than about 20 bar, no more than about 15 bar, no more than about 10 bar, no more than about 9 bar, no more than about 8 bar, no more than about 7 bar, no more than about 6 bar, no more than about 5 bar, no more than about 4 bar, no more than about 3 bar, or no more than about 2 bar. Combinations of the above-referenced pressure gradients maintained by the pressure reducer 140 are also possible (e.g., at least about 1 bar and no more than about 50 bar or at least about 10 bar and no more than about 30 bar), inclusive of all values and ranges therebetween. In some embodiments, the pressure reducer 140 can maintain a pressure difference between the coolant transmitter 110 and the evaporation vessel 130 of about 1 bar, about 2 bar, about 3 bar, about 4 bar, about 5 bar, about 6 bar, about 7 bar, about 8 bar, about 9 bar, about 10 bar, about 15 bar, about 20 bar, about 25 bar, about 30 bar, about 35 bar, about 40 bar, about 45 bar, or about 50 bar.

Figure 2:
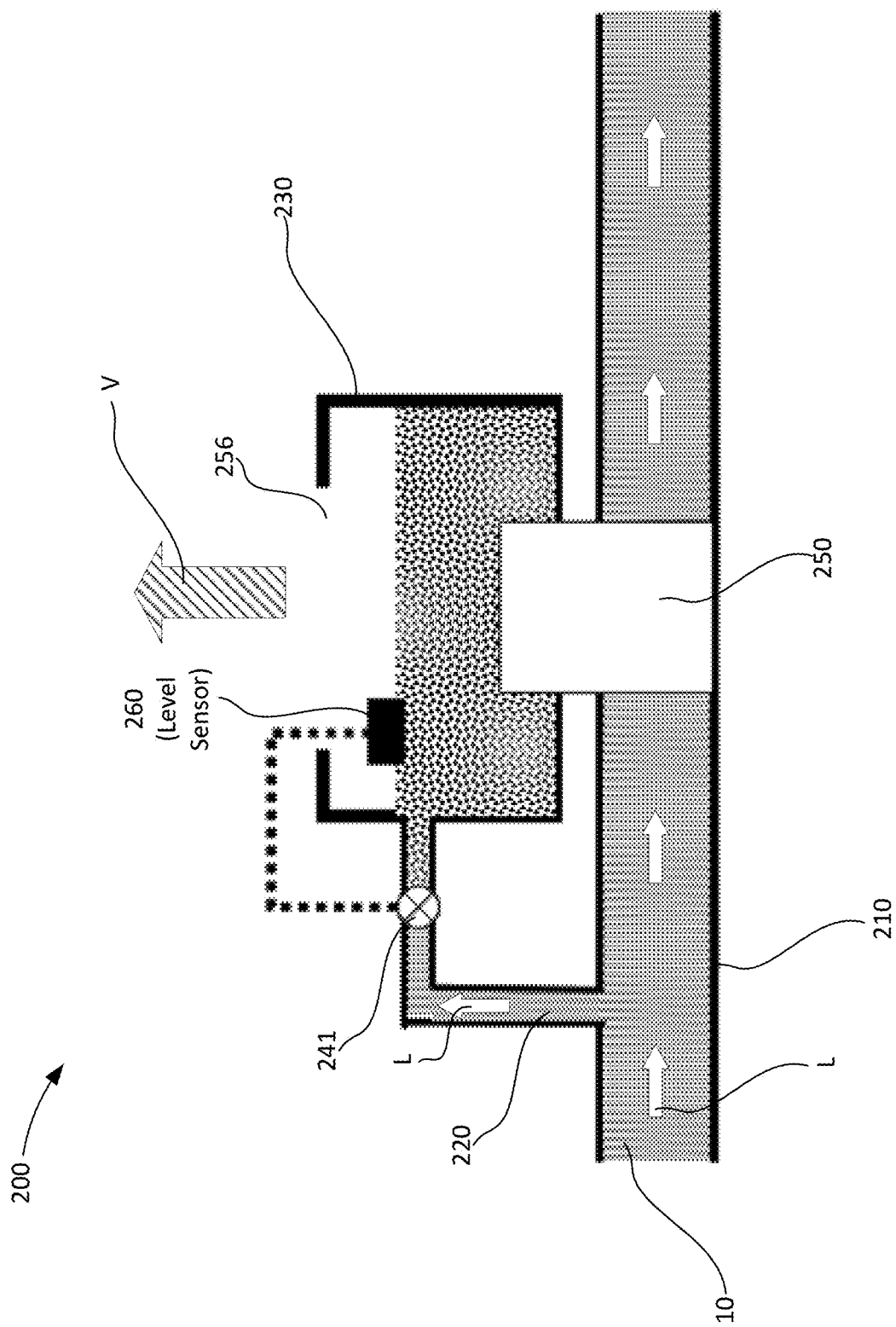
FIG. 2 illustrates a cooling system including a throttle, a level sensor, and a heat exchanger, according to an embodiment.

FIG. 2 illustrates a cooling system 200, according to an embodiment. The cooling system 200 includes a coolant transmitter 210, an exit stream conduit 220, an evaporation vessel 230, a throttle 241, a heat exchanger 250, an exit vent 256, and a level sensor 260. In some embodiments, the coolant transmitter 210 and the evaporation vessel 230 can be the same or substantially similar to the coolant transmitter 110 and the evaporation vessel 130, as described above with reference to FIG. 1. Thus, certain aspects of the coolant transmitter 210 and the evaporation vessel 230 are not described in greater detail herein. Also shown in FIG. 2 is a coolant 10. As shown, the coolant 10 flows as a liquid along liquid lines L and as a vapor along vapor lines V.

In some embodiments, the coolant transmitter 210 can be coupled to a power transmission line at an initial end of the coolant transmitter 210 and at a terminal end of the coolant transmitter 210. The coolant 10 moves through the coolant transmitter 210 as a liquid. In some embodiments, the coolant transmitter 210 can include a pipe, multiple pipes, conduits, or any combination thereof. In some embodiments, the coolant transmitter 210 can include an insulation layer. In some embodiments, the coolant transmitter 210 can run underground.

The exit stream conduit 220 diverts a portion of the coolant 10 from the coolant transmitter 210 to the evaporation vessel 230. The exit stream conduit 220 and the throttle 241 fluidically couple the coolant transmitter 210 to the evaporation vessel 230. In some embodiments, the opening of the throttle 241 can control the flow of the coolant 10 through the exit stream conduit 220. In some embodiments, the level sensor 260 can control the opening of the throttle 241. In other words, the amount of the coolant 10 that is diverted from the coolant transmitter 210 can be controlled based on how much coolant is in the evaporation vessel 230. In some embodiments, the exit stream conduit 220 can include a thermal insulation layer.

The coolant 10 in the evaporation vessel 230 boils and draws heat from the coolant transmitter 210 via the heat exchanger 250. In some embodiments, the evaporation vessel 230 can be vented (i.e., via the exit vent 256) to the atmosphere and be held at atmospheric pressure. In some embodiments, the evaporation vessel 230 can be vented to a pressure above atmospheric pressure. In some embodiments, the evaporation vessel 230 can be vented to a pipe that transports vapor to a further heat exchanger (not shown) that warms the vapor to an ambient temperature prior to venting. In some embodiments, the evaporation vessel 230 can include a layer of insulation disposed around the outside of the evaporation vessel 230. In some embodiments, a portion of the coolant 10 can be captured after boiling from the evaporation vessel 230 for later use.

In some embodiments, the evaporation vessel 230 can have a volume of at least about $0.001$ m$^3$, at least about $0.002$ m$^3$, at least about $0.003$ m$^3$, at least about $0.004$ m$^3$, at least about $0.005$ m$^3$, at least about $0.006$ m$^3$, at least about $0.007$ m$^3$, at least about $0.008$ m$^3$, at least about $0.009$ m$^3$, at least about $0.01$ m$^3$, at least about $0.02$ m$^3$, at least about $0.03$ m$^3$, at least about $0.04$ m$^3$, at least about $0.05$ m$^3$, at least about $0.06$ m$^3$, at least about $0.07$ m$^3$, at least about $0.08$ m$^3$, at least about $0.09$ m$^3$, at least about $0.1$ m$^3$, at least about $0.2$ m$^3$, at least about $0.3$ m$^3$, at least about $0.4$ m$^3$, at least about $0.5$ m$^3$, at least about $0.6$ m$^3$, at least about $0.7$ m$^3$, at least about $0.8$ m$^3$, at least about $0.9$ m$^3$, at least about $1$ m$^3$, at least about $2$ m$^3$, at least about $3$ m$^3$, at least about $4$ m$^3$, at least about $5$ m$^3$, at least about $6$ m$^3$, at least about $7$ m$^3$, at least about $8$ m$^3$, at least about $9$ m$^3$, at least about $10$ m$^3$, at least about $20$ m$^3$, at least about $30$ m$^3$, at least about $40$ m$^3$, or at least about $50$ m$^3$. In some embodiments, the evaporation vessel 230 can have a volume of no more than about $50$ m$^3$, no more than about $40$ m$^3$, no more than about $30$ m$^3$, no more than about $20$ m$^3$, no more than about $10$ m$^3$, no more than about $9$ m$^3$, no more than about $8$ m$^3$, no more than about $7$ m$^3$, no more than about $6$ m$^3$, no more than about $5$ m$^3$, no more than about $4$ m$^3$, no more than about $3$ m$^3$, no more than about $2$ m$^3$, no more than about $1$ m$^3$, no more than about $0.9$ m$^3$, no more than about $0.8$ m$^3$, no more than about $0.7$ m$^3$, no more than about $0.6$ m$^3$, no more than about $0.5$ m$^3$, no more than about $0.4$ m$^3$, no more than about $0.3$ m$^3$, no more than about $0.2$ m$^3$, no more than about $0.1$ m$^3$, no more than about $0.09$ m$^3$, no more than about $0.08$ m$^3$, no more than about $0.07$ m$^3$, no more than about $0.06$ m$^3$, no more than about $0.05$ m$^3$, no more than about $0.04$ m$^3$, no more than about $0.03$ m$^3$, no more than about $0.02$ m$^3$, no more than about $0.01$ m$^3$, no more than about $0.009$ m$^3$, no more than about $0.008$ m$^3$, no more than about $0.007$ m$^3$, no more than about $0.006$ m$^3$, no more than about $0.005$ m$^3$, no more than about $0.004$ m$^3$, no more than about $0.003$ m$^3$, no more than about $0.002$ m$^3$, or no more than about $0.001$ m$^3$. Combinations of the above-referenced volumes of the evaporation vessel 230 are also possible (e.g., at least about $0.001$ m$^3$ and no more than about 50 m3, or at least about $0.1$ m$^3$ and no more than about $50$ m$^3$), inclusive of all values and ranges therebetween. In some embodiments, the evaporation vessel 230 can have a volume of about $0.1$ m$^3$, about $0.2$ m$^3$, about $0.3$ m$^3$, about $0.4$ m$^3$, about $0.5$ m$^3$, about $0.6$ m$^3$, about $0.7$ m$^3$, about $0.8$ m$^3$, about 0.9 m³, about 1 m³, about 2 m³, about 3 m³, about 4 m³, about 5 m³, about 6 m³, about 7 m³, about 8 m³, about 9 m³, about 10 m³, about 20 m³, about 30 m³, about 40 m³, or about 50 m³.

The throttle 241 acts as a flow regulator at an interface between the exit stream conduit 220 and the evaporation vessel 230. In some embodiments, the throttle 241 can act as a pressure regulator or pressure reducer at an interface between the exit stream conduit 220 and the evaporation vessel 230. In some embodiments, the throttle 241 can have the same or substantially similar properties to the pressure reducer 140, as described above with reference to FIG. 1. In some embodiments, the cooling system 200 can include an orifice or multiple orifices at the interface between the exit stream conduit 220 and the evaporation vessel 230. In some embodiments, the throttle 241 can include a valve. In some embodiments, the throttle 241 can include multiple valves.

The heat exchanger 250 has a first side fluidically coupled to the coolant transmitter 210 and a second side fluidically coupled to the evaporation vessel 230. In some embodiments, the heat exchanger 250 can include a shell and tube heat exchanger. In some embodiments, the first side can be a shell side of the shell and tube heat exchanger. In some embodiments, the first side can be a tube side of the shell and tube heat exchanger. In some embodiments, the second side can be a shell side of the shell and tube heat exchanger. In some embodiments, the second side can be a tube side of the shell and tube heat exchanger. In some embodiments, the heat exchanger 250 can include a parallel flow heat exchanger, a counter flow heat exchanger, a finned tubular heat exchanger, a single pass heat exchanger, a two pass heat exchanger, a U-tube heat exchanger, a compact heat exchanger, a plate-fin heat exchanger, a spiral tube heat exchanger, or any combination thereof. In some embodiments, the heat exchanger 250 can include a surface enhanced for forced convective heat transfer.

In some embodiments, the level sensor 260 can communicate with the throttle 241 to control the opening of the throttle 241. In some embodiments, the level sensor 260 can include an optical sensor, a capacitive sensor, a conductive sensor, a diaphragm sensor, a float sensor, or any combination thereof.

Figure 3:
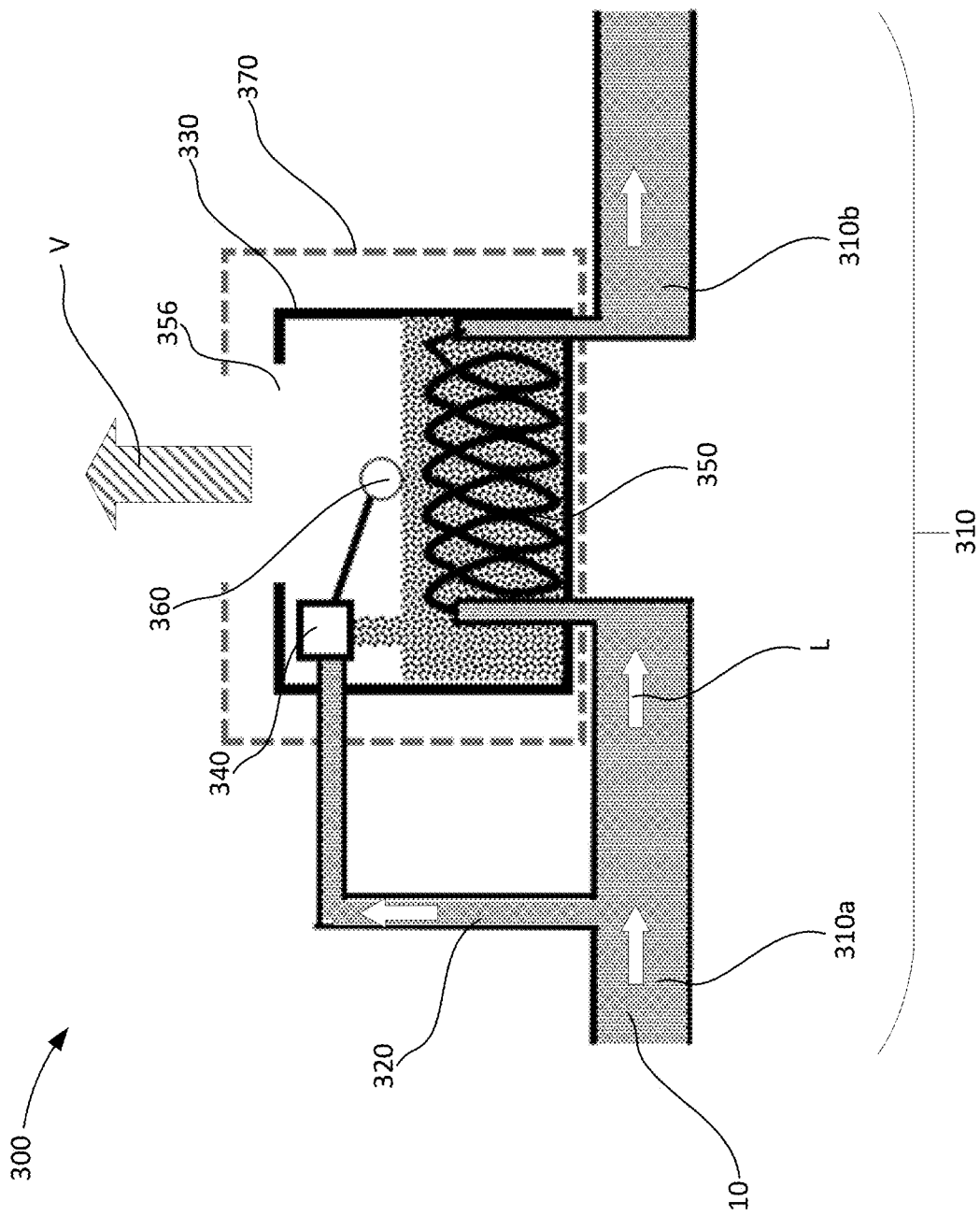
FIG. 3 illustrates a cooling system including a level sensor, a thermally insulating jacket, and a heat exchanger, according to an embodiment.

FIG. 3 illustrates a cooling system 300, according to an embodiment. The cooling system 300 includes a coolant transmitter 310 (divided into a first portion 310a and a second portion 310b), an exit stream conduit 320, an evaporation vessel 330, a pressure regulator 340 (e.g., a float valve), a heat exchanger 350, an exit vent 356 a level sensor 360, and a TIJ 370.

In some embodiments, the coolant transmitter 310, the exit stream conduit 320, the evaporation vessel 330, the heat exchanger 350, and the level sensor 360 can be the same or substantially similar to the coolant transmitter 210, the exit stream conduit 220, the evaporation vessel 230, the heat exchanger 250, and the level sensor 260, as described above with reference to FIG. 2. In some embodiments, the pressure regulator 340 can be the same or substantially similar to the pressure reducer 140, as described above with reference to FIG. 1. Thus, certain aspects of the coolant transmitter 310, the exit stream conduit 320, the evaporation vessel 330, the pressure regulator 340, the heat exchanger 350, and the level sensor 360 are not described in greater detail herein. As shown, the coolant 10 flows as a liquid along arrows L and as a vapor along arrow V (via exit vent 356).

The coolant 10 is open to atmospheric pressure via the exit vent 356, and will consequently boil at about 77.4 K due to heat from the coolant 10 in the coolant transmitter 310. In some embodiments, the cooling system 300 can be placed on top of the poles supporting an overhead superconducting power transmission line. In some embodiments, the cooling system 300 can be placed in an underground vault for use during operation of an underground superconducting power transmission line.

As shown, the coolant transmitter 310 is divided into the first portion 310a and the second portion 310b. The first portion 310a transports the coolant 10 from an initial end of the coolant transmitter 310 to the heat exchanger 350. The second portion 310b transports the coolant 10 from the heat exchanger 350 to the terminal end of the coolant transmitter 310. As shown, the heat exchanger 350 is fully submersed in the coolant 10 boiling in the evaporation vessel 330. In some embodiments, the heat exchanger 350 can be partially submersed in the coolant 10 boiling in the evaporation vessel 330. As shown, the heat exchanger 350 has a spiral shape. In some embodiments, the heat exchanger 350 can be formulated to maximize heat exchange between the coolant 10 boiling in the evaporation vessel 330 and the coolant 10 flowing through the heat exchanger 350.

As shown, the level sensor 360 is physically coupled to the pressure regulator 340. In some embodiments, the level sensor 360 can be physically coupled to an inner wall of the evaporation vessel 330.

As shown, the TIJ 370 is disposed around the outside of the evaporation vessel 330. In some embodiments, the TIJ 370 can aid in minimizing boil off of the coolant. In some embodiments, the TIJ 370 can include fiberglass, polyurethane, down insulation, polyester, fibers, polyfill, or any combination thereof. In some embodiments, the TIJ 370 can include a dual wall vacuum jacket that is optionally supplemented by one or more layers of additional insulative materials (e.g., fiberglass, polyurethane, down insulation, polyester, fibers, polyfill, or any combination thereof). In some embodiments, the dual wall vacuum jacket can be disposed around the outside of the evaporation vessel 330 without additional layers of insulative materials. In some embodiments, the TIJ 370 can have a thickness of at least about 1 mm, at least about 2 mm, at least about 3 mm, at least about 4 mm, at least about 5 mm, at least about 6 mm, at least about 7 mm, at least about 8 mm, at least about 9 mm, at least about 1 cm, at least about 2 cm, at least about 3 cm, at least about 4 cm, at least about 5 cm, at least about 6 cm, at least about 7 cm, at least about 8 cm, at least about 9 cm, at least about 10 cm, at least about 20 cm, at least about 30 cm, at least about 40 cm, at least about 50 cm, at least about 60 cm, at least about 70 cm, at least about 80 cm, or at least about 90 cm. In some embodiments, the TIJ 370 can have a thickness of no more than about 1 m, no more than about 90 cm, no more than about 80 cm, no more than about 70 cm, no more than about 60 cm, no more than about 50 cm, no more than about 40 cm, no more than about 30 cm, no more than about 20 cm, no more than about 10 cm, no more than about 9 cm, no more than about 8 cm, no more than about 7 cm, no more than about 6 cm, no more than about 5 cm, no more than about 4 cm, no more than about 3 cm, no more than about 2 cm, no more than about 1 cm, no more than about 9 mm, no more than about 8 mm, no more than about 7 mm, no more than about 6 mm, no more than about 5 mm, no more than about 4 mm, no more than about 3 mm, or no more than about 2 mm. Combinations of the above-referenced thicknesses of the TIJ 370 are also possible (e.g., at least about 1 mm and no more than about 1 m or at least about 1 cm and no more than about 20 cm), inclusive of all values and ranges therebetween. In some embodiments, the TIJ 370 can have a thickness of about 1 mm, about 2 mm, about 3 mm, about 4 mm, about 5 mm, about 6 mm, about 7 mm, about 8 mm, about 9 mm, about 1 cm, about 2 cm, about 3 cm, about 4 cm, about 5 cm, about 6 cm, about 7 cm, about 8 cm, about 9 cm, about 10 cm, about 20 cm, about 30 cm, about 40 cm, about 50 cm, about 60 cm, about 70 cm, about 80 cm, about 90 cm, or about 1 m.

Figure 4:
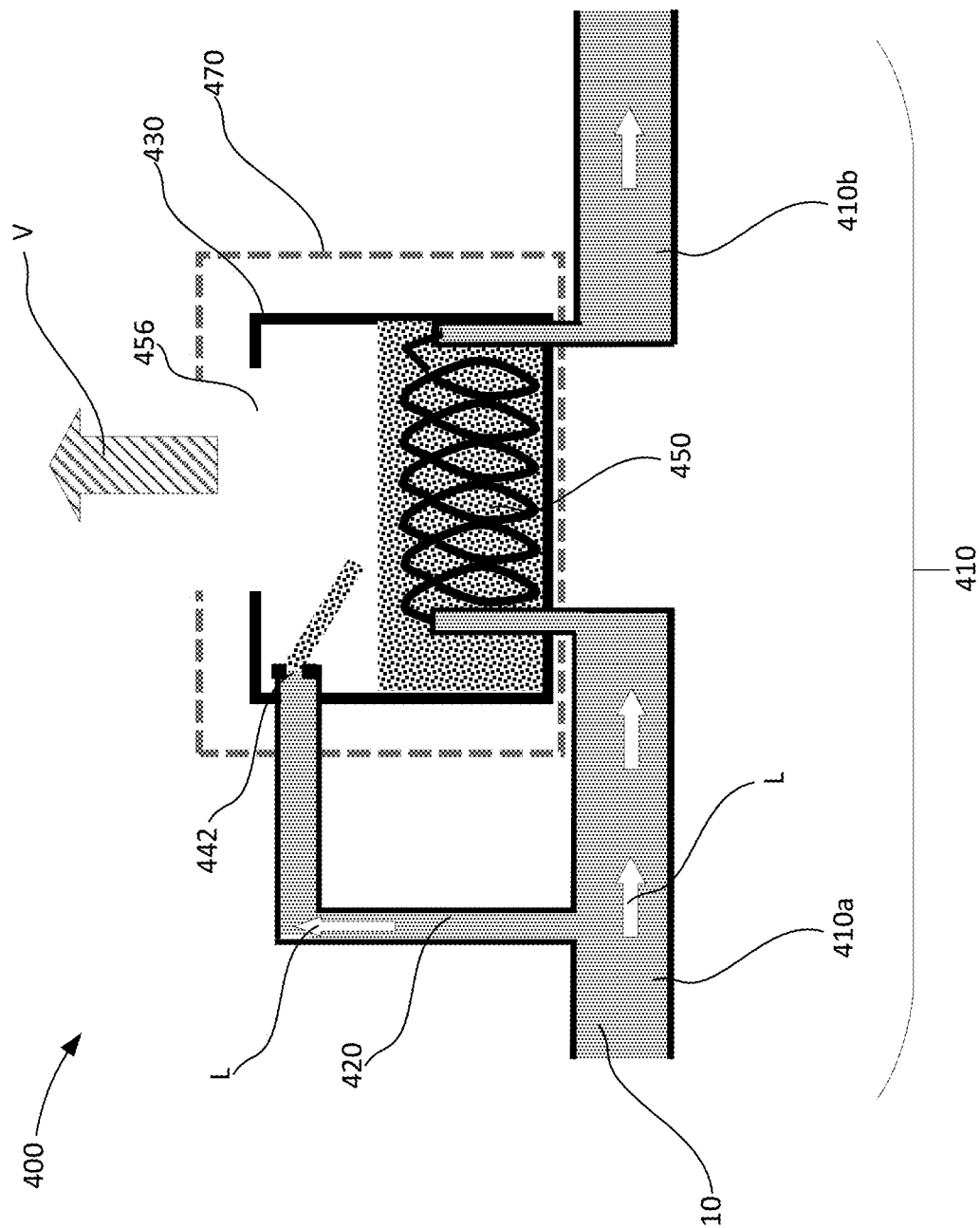
FIG. 4 illustrates a cooling system including an orifice, a thermally insulating jacket, and a heat exchanger, according to an embodiment.

FIG. 4 illustrates a cooling system 400, according to an embodiment. As shown, the cooling system 400 includes a coolant transmitter 410 (divided into a first portion 410a and a second portion 410b), an exit stream conduit 420, an evaporation vessel 430, an orifice 442, a heat exchanger 450, an exit vent 456, a TIJ 470, and, optionally, a level sensor (not shown). In some embodiments, the coolant transmitter 410, the exit stream conduit 420, the evaporation vessel 430, the heat exchanger 450, the exit vent 456, the TIJ 470, and the optional level sensor can be the same or substantially similar to the coolant transmitter 310, the exit stream conduit 320, the evaporation vessel 330, the heat exchanger 350, the exit vent 356, the TIJ 370, and the level sensor 360 as described above with reference to FIG. 3. Thus, certain aspects of the coolant transmitter 410, the exit stream conduit 420, the evaporation vessel 430, the heat exchanger 450, the TIJ 470, and the level sensor are not described in greater detail herein. As shown, the coolant 10 flows as a liquid along liquid lines L and as a vapor along vapor lines V.

As shown, the orifice 442 regulates flow of the coolant 410 between the exit stream conduit 420 and the evaporation vessel 430. The orifice 442 also acts as a pressure regulator, regulating the pressure difference between the exit stream conduit 420 and the evaporation vessel 430. In some embodiments, the orifice 442 can include one opening. In some embodiments, the orifice 442 can include multiple openings (e.g., a grate). In some embodiments, the orifice 442 can include other impediments/impedance to fluid flow, such as a valve or a throttle. In some embodiments, the orifice 442 can be included in the cooling system 400 without valves or level sensors disposed in the evaporation vessel 430. In some embodiments, the pressure in the coolant transmitter 410 can change along the length of the coolant transmitter 410 due to hydrostatic head loss. Therefore, the size of the orifice 442 and/or the number of openings included in the orifice 442 can vary with location along the coolant transmitter 410. For example, if the orifice 442 is at a first location along the coolant transmitter 410, it can have a first diameter. If the orifice 442 is at a second location along the coolant transmitter 410, the second location downstream of the first location, the orifice 442 can have a second diameter larger than the first diameter. Since the pressure is lower at the second location, the orifice 442 would be larger at the second location to deliver similar flow rate of coolant 10 through the orifice 442. However, flow rate across the orifice 442 can vary proportionally to the square root of the pressure differential across the orifice 442. Consequently, the diameter of the orifice 442 for a given flow rate at different pressures varies with the fourth root of the pressure. This is a weak dependence and can allow for a single orifice size to provide adequate flow of the coolant 10 over a range of pressures along the coolant transmitter 410. The amount of cooling employed by the cooling system 400 can be varied by controlling inlet pressure and/or flow rate of coolant through the cooling system 400.

Figure 5A:
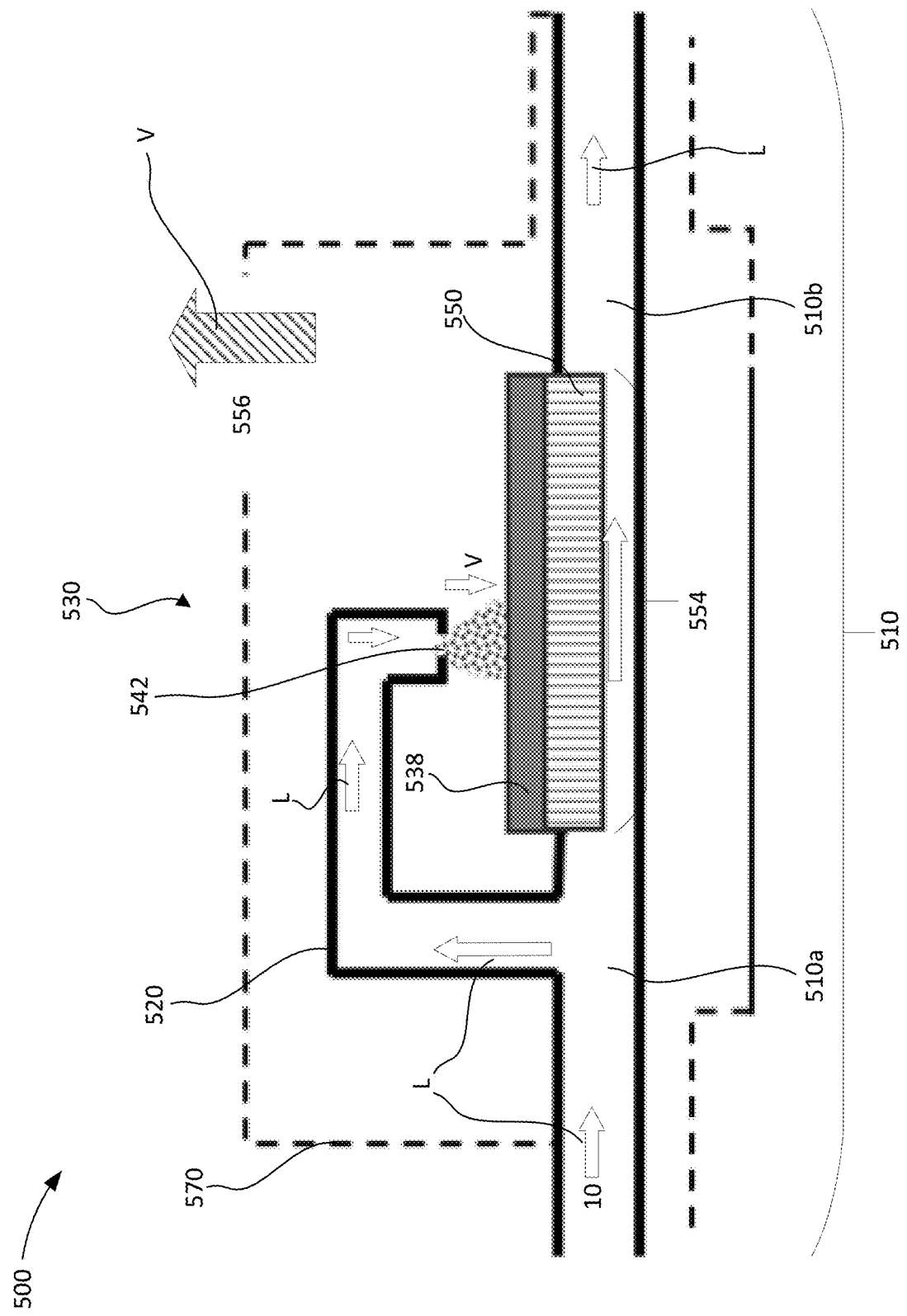
FIGS. 5A-5B illustrate a cooling system with a spray mechanism, according to an embodiment.
Figure 5B:
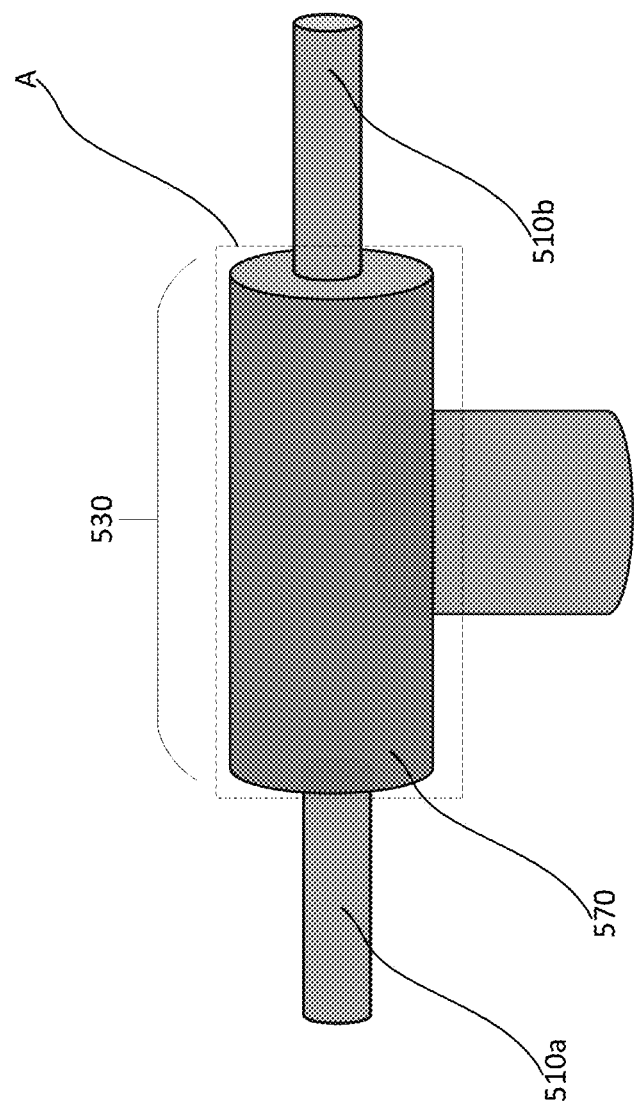

FIGS. 5A-5B illustrate a cooling system 500 and various components thereof, according to an embodiment. As shown, the cooling system 500 includes a coolant transmitter 510 (including a first portion 510a and a second portion 510b), an exit stream conduit 520, an evaporation vessel 530, a thermal plate 538, an orifice 542, a heat exchanger 550, a heat exchange region 554, and a TIJ 570. In some embodiments, the coolant transmitter 510, the first portion 510a, the second portion 510b, the exit stream conduit 520, the evaporation vessel 530, the orifice 542, the heat exchanger 550, and the TIJ 570 can be the same or substantially similar to the coolant transmitter 410, the first portion 410a, the second portion 410b, the exit stream conduit 420, the evaporation vessel 430, the orifice 442, the heat exchanger 450, and the TIJ 470 as described above with reference to FIG. 4. Thus, certain aspects of the coolant transmitter 510, the first portion 510a, the second portion 510b, the exit stream conduit 520, the evaporation vessel 530, the orifice 542, the heat exchanger 550, and the TIJ 570 are not described in greater detail herein. As shown, the coolant 10 flows as a liquid along liquid lines L and as a vapor along vapor lines V.

FIG. 5A shows a cross section of the cooling system 500 while FIG. 5B shows an external view of the coolant transmitter 510 and the evaporation vessel 530. FIG. 5B shows box A, along which FIG. 5A is viewed. In some embodiments, the cooling system 500 can be suspended on an OH power transmission line conductor, optionally far from support structures or support poles. In some embodiments, the cooling system 500 can be in an underground vault or conduit as part of an underground power transmission line. In some embodiments, the cooling system 500 can operate at any angle and move laterally.

The coolant transmitter 510 receives the coolant from a power transmission line. The coolant transmitter 510 feeds (or is fluidically coupled) to an inlet to the heat exchange region 554. The coolant transmitter 510 is fluidically coupled to the exit stream conduit 520. Coolant from the coolant transmitter 510 flows through the exit stream conduit 520 and exits through the orifice 542 as a vapor stream along vapor line V. The coolant 10 makes contact with the heat exchanger 550 as a vapor, more specifically with the heat exchange region 554. Heat is drawn from the liquid coolant in the heat exchange region 554 to the thermal plate 538. Heat is then drawn from the thermal plate 538 to the vapor coolant external to and in contact with the thermal plate 538. In some embodiments, the inclusion of more coils and/or an increase to the surface area in the heat exchanger 550 can give rise to a more substantial transfer of heat. Once the liquid coolant exits the heat exchanger 550, it has reduced in temperature due to the heat transfer to the coolant vapor at or near atmospheric pressure. In other words, the spraying of the coolant 10 onto the thermal plate 538 and the subsequent boiling thereof (collectively referred to as "spray boiling") causes the heat to transfer from the liquid coolant in the heat exchanger 550 to the vapor coolant on the outside of the heat exchanger 550.

As shown, the evaporation vessel 530 includes the thermal plate 538 and is bounded on either side by the TIJ 570. In some embodiments, the evaporation vessel 530 may not include any "walls" bounding the evaporation vessel 530 on either side. In other words, the evaporation vessel 530 can simply refer to an open space or volume into which the coolant 10 is sprayed and where the sprayed coolant 10 subsequently boils. The thermal plate 538 can maximize contact between vapor coolant ejected from the exit stream conduit 520 and the heat exchange region 554. In some embodiments, vapor coolant can be kept near the heat exchange region 554 and condense, vaporize, and/or boil in close proximity to the heat exchange region 554 rather than falling away from the heat exchange region 554.

The orifice 542 regulates flow of the coolant 10 out of the exit stream conduit 520. In some embodiments, the orifice 542 can also regulate the pressure differential between the exit stream conduit 520 and the evaporation vessel 530. In some embodiments, the orifice 542 can be designed to minimize coolant flooding of the heat exchange region 554. In other words, the orifice 542 can be adjustable based on how much of the coolant 10 is in close proximity to the heat exchange region 554. In some embodiments, a level sensor can detect how much of the coolant is in the evaporation vessel 530 and/or in close proximity to the heat exchange region 554.

In some embodiments, the cooling system 500 can operate in a narrow temperature range (e.g., between about 78K and about 79K), and multiple such cooling systems 500 may be placed at close intervals along a transmission line. In some embodiments, the coolant 10 that passes through the cooling system 500 can be maintained within a narrow temperature range, such that the difference between a maximum temperature and a minimum temperature of the coolant 10 passing through the cooling system 500 is no more than about 5 K, no more than about 4 K, no more than about 3 K, no more than about 2 K, no more than about 1 K, no more than about 0.9 K, no more than about 0.8 K, no more than about 0.7 K, no more than about 0.6 K, or no more than about 0.5 K. In some embodiments, the spray of the coolant 10 through the orifice 542 can be continuous or constant. In some embodiments, the orifice 542 can be sized such that the coolant 10 does not accumulate as a liquid along outside surfaces of the heat exchanger 550. In some embodiments, the orifice 542 can be sized such that the coolant 10 does not accumulate as a liquid along any outside surfaces of the cooling system 500. In some embodiments, the cooling system 500 can be vented directly to the atmosphere.

Figure 6:
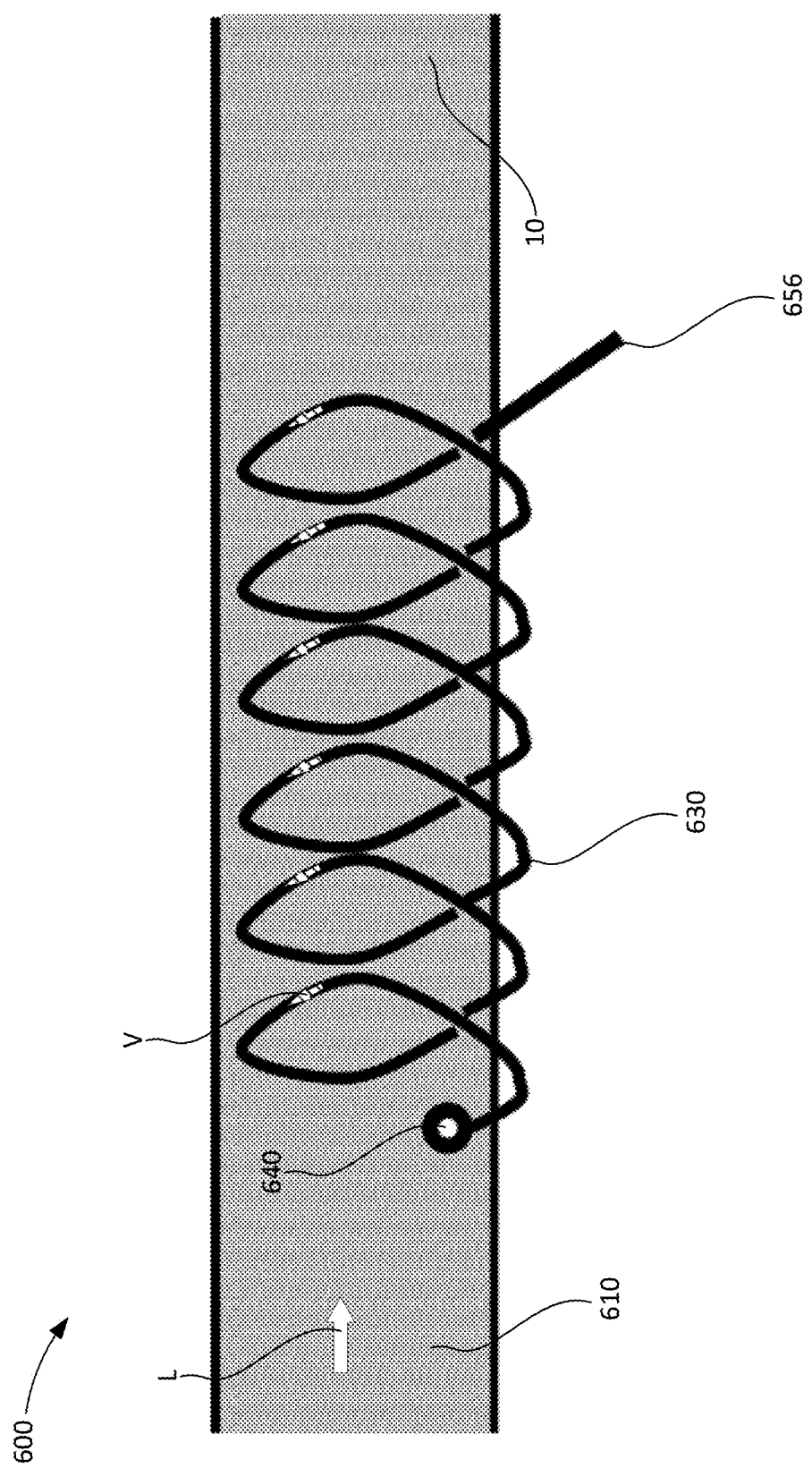
FIG. 6 illustrates a cooling system with a heat exchanger as an evaporation vessel, according to an embodiment.

FIG. 6 illustrates a cooling system 600, according to an embodiment. As shown, the cooling system 600 includes a coolant transmitter 610, an evaporation vessel 630, a pressure regulator 640, and an exit vent 656. In some embodiments, the coolant transmitter 610, the evaporation vessel 630, and the pressure regulator 640 can be the same or substantially similar to the coolant transmitter 110, the evaporation vessel 130, and the pressure reducer 140, as described above with reference to FIG. 1. Thus, certain aspects of the coolant transmitter 610, the evaporation vessel 630, and the pressure regulator 640 are not described in greater detail herein. Also shown in FIG. 6 is a coolant 10. As shown, the coolant 10 flows as a liquid along liquid lines L and as a vapor along vapor lines V.

In some embodiments, the coolant 10 can enter the coolant transmitter 610 from a power transmission line and move through the coolant transmitter 610 along the liquid lines L. The coolant 10 passes around the outside of the evaporation vessel 630. As shown the evaporation vessel 630 is a spiral tube heat exchanger. The coolant 10 enters the evaporation vessel 630 through the pressure regulator 640. As shown, the evaporation vessel 630 is partially disposed in the coolant transmitter 610. In some embodiments, the evaporation vessel 630 can be fully disposed in the coolant transmitter 610.

In some embodiments, the evaporation vessel 630 can be vented to atmospheric pressure or near atmospheric pressure via the exit vent 656. In some embodiments, heat transfer from the evaporation vessel 630 can be via forced convective cooling of the coolant 10 surrounding the evaporation vessel 630. As shown, the evaporation vessel 630 is spiral in shape. In some embodiments, the evaporation vessel 630 can include any shape suitable for heat transfer.

In some embodiments, the coolant transmitter 610 can directly encase a transmission line conductor (not shown). In other words, the transmission line conductor can run through the coolant transmitter 610. In some embodiments, the cooling system 600 can include a superconducting cable (not shown) disposed in the coolant transmitter 610 and running the length of the coolant transmitter 610. In some embodiments, the cooling system 600 can include a structural tension cable (not shown) disposed in the coolant transmitter 610 and running the length of the coolant transmitter 610. In some embodiments, the transmission line conductor, the superconducting cable, and/or the structural tension cable can run through a space surrounded by coolant transmitter 610.

In some embodiments, the evaporation vessel 630 can be a heat exchange tube that extends along a portion of the length of the coolant transmitter 610. In some embodiments, the evaporation vessel 630 can be a heat exchange tube that extends along the entire length of the coolant transmitter 610. In some embodiments, multiple heat exchange tubes can be disposed along the length of a power transmission line, optionally with multiple vents along the length of the power transmission line, for periodic venting. In some embodiments, the multiple heat exchange tubes can be spaced apart from one another. In other embodiments, some or all of the multiple heat exchange tubes can be joined together to form a continuous chain of heat exchange tubes, to cover some or all of the length of the power transmission line.

FIG. 7 illustrates a cooling system 700, according to an embodiment. As shown, the cooling system 700 includes a coolant transmitter 710, an evaporation vessel 730, an orifice 742, and an exit vent 756. In some embodiments, the coolant transmitter 710 and the evaporation vessel 730 can be the same or substantially similar to the coolant transmitter 110 and the evaporation vessel 130, as described above with reference to FIG. 1. In some embodiments, the orifice 742 can be the same or substantially similar to the orifice 442, as described above with reference to FIG. 4. In some embodiments, the exit vent 756 can be the same or substantially similar to the exit vent 656, as described above with reference to FIG. 6. Thus, certain aspects of the coolant transmitter 710, the evaporation vessel 730, the orifice 742, and the exit vent 756 are not described in greater detail herein. As shown, the coolant 10 flows as a liquid along liquid lines L and as a vapor along vapor lines V.

As shown, the coolant 10 flows through the coolant transmitter 710 along liquid lines L and a portion of the coolant 10 is diverted to the evaporation vessel 730 via the orifice 742. The coolant 10 then flows through the evaporation vessel 730 along vapor lines V. Heat is transferred from the coolant transmitter 710 to the evaporation vessel 730. The coolant 10 exits the evaporation vessel 730 via the exit vent 756. As shown, the coolant 10 flows through the evaporation vessel 730 counter current to the flow of the coolant 10 through the coolant transmitter 710. In some embodiments, the coolant 10 can flow through the evaporation vessel 730 parallel to the coolant transmitter 710. In some embodiments, the evaporation vessel 730 can be an annular space around the coolant transmitter 710. In other words, the evaporation vessel can envelop or surround the coolant transmitter 710. In some embodiments, the cooling system can be fixed to a power transmission line, such that the evaporation vessel 730 is in contact with the power transmission line.

In some embodiments, the coolant transmitter 710 can directly encase a transmission line conductor (not shown). In other words, the transmission line conductor can run through the coolant transmitter 710. In some embodiments, the cooling system 700 can include a superconducting cable (not shown) disposed in the coolant transmitter 710 and running the length of the coolant transmitter 710. In some embodiments, the cooling system 700 can include a structural tension cable (not shown) disposed in the coolant transmitter 710 and running the length of the coolant transmitter 710. In some embodiments, the transmission line conductor, the superconducting cable, and/or the structural tension cable can run through a space surrounded by the evaporation vessel 730.

FIG. 8 illustrates a cooling system 800, according to an embodiment. As shown, the cooling system 800 includes a coolant transmitter 810 (also referred to as a "header tube"), an exit stream conduit 820, a spray tube 822, an evaporation vessel 830, a throttle 841, an orifice 842, an exit vent 856, and a level sensor 860. In some embodiments, the coolant transmitter 810, the exit stream conduit 820, the evaporation vessel 830, the orifice 842, and the exit vent 856 can be the same or substantially similar to the coolant transmitter 710, the exit stream conduit 720, the evaporation vessel 730, the orifice 742, and the exit vent 756, as described above with reference to FIG. 7. In some embodiments, the throttle 841 and the level sensor 860 can be the same or substantially similar to the throttle 241 and the level sensor 260, as described above with reference to FIG. 2. Thus, certain aspects of the coolant transmitter 810, the exit stream conduit 820, the evaporation vessel 830, the throttle 841, the exit vent 856, and the level sensor 860 are not described in greater detail herein. As shown, the coolant 10 flows as a liquid along liquid lines L and as a vapor along vapor lines V.

As shown, a portion of the coolant 10 flowing through the coolant transmitter 810 is diverted to the exit stream conduit 820. From the exit stream conduit 820, the coolant 10 flows through the throttle 841 to enter the spray tube 822. The throttle 841 regulates flow of coolant 10 from the coolant transmitter 810 to the spray tube 822. In some embodiments, the throttle 841 can include one or more valves. The coolant 10 flows through the spray tube 822 along liquid lines L. The coolant 10 flows from the spray tube 822 into the evaporation vessel 830 via the orifice 842. The coolant 10 enters the evaporation vessel 830 as a vapor. In some embodiments, the coolant 10 is sprayed into the evaporation vessel 830 where the coolant 10 subsequently boils. Conduction occurs across the walls of the coolant transmitter 810 and the spray tube 822 to transfer heat from the evaporation vessel 830 to the coolant transmitter 810 and the spray tube 822. In addition, forced convective heat transfer occurs between the coolant 10 in the evaporation vessel 830 and the coolant 10 in the coolant transmitter 810 and the spray tube 822. As shown, the coolant 10 flows through the evaporation vessel 830 counter current to the flow of the coolant 10 through the coolant transmitter 810 and the spray tube 822. In some embodiments, the coolant 10 can flow through the evaporation vessel 830 parallel to the coolant transmitter 810 and the spray tube 822.

If an excess amount of the coolant 10 exits the spray tube 822 to the evaporation vessel 830, some of the coolant 10 can accumulate in the evaporation vessel 830 as a liquid. The level sensor 860 detects the level of liquid in the evaporation vessel 830 and can communicate with the throttle 841. For example, if the level sensor 860 detects more than a desired amount of liquid in the evaporation vessel 830, the throttle 841 can adjust its opening such that less of the coolant 10 passes into the spray tube 822, and consequently less of the coolant 10 passes into the evaporation vessel 830 via the orifice 842. Conversely, if the amount of heat transfer between the evaporation vessel 830 and the coolant transmitter 810 and the spray tube 822 is less than desired (e.g., detected via temperature sensors), the throttle 841 can adjust its opening such that more of the coolant 10 passes into the spray tube 822. Consequently, more of the coolant 10 would then pass into the evaporation vessel 830.

FIGS. 9A-9B illustrate a cooling system 900 and various components thereof, according to an embodiment. As shown, the cooling system 900 includes a coolant transmitter 910, evaporation vessels 930A, 930B (collectively referred to as evaporation vessels 930 or "cooling tubes"), a throttle 941, orifices 942A, 942B (collectively referred to as orifices 942), exit vents 956A, 956B, (collectively referred to as exit vents 956), and a level sensor 960. In some embodiments, the coolant transmitter 910, the evaporation vessels 930, the throttle 941, the orifices 942, the exit vents 956, and the level sensor 960 can be the same or substantially similar to the coolant transmitter 810, the evaporation vessel 830, the throttle 841, the orifice 842, the exit vent 856, and the level sensor 860, as described above with reference to FIG. 8. Thus, certain aspects of the coolant transmitter 910, the evaporation vessels 930, the throttle 941, the orifices 942, the exit vents 956, and the level sensor 960 are not described in greater detail herein. As shown, the coolant 10 flows as a liquid along liquid lines L and as a vapor along vapor lines V.

FIG. 9A illustrates a cooling system 900, while FIG. 9B illustrates the entry of liquid coolant into the evaporation vessel 930A via the orifice 942A. As shown in FIG. 9B, the coolant 10 enters the orifice 942A as a pressurized liquid, flowing along liquid line L. Upon entry into the evaporation vessel 930A, the coolant 10 expands to become a vapor, as the evaporation vessel 930A is maintained at a lower pressure than the coolant transmitter 910. In other words, the coolant is sprayed into the evaporation vessels 930 and boils on contact with a warmer surface or on mixing with warmer vapor, thereby cooling the evaporation vessels 930.

As shown, the evaporation vessels 930 are tubes disposed in the coolant transmitter 910. As shown, the coolant 10 flows through a portion of the evaporation vessels 930 counter current to the flow of the coolant 10 through the coolant transmitter 910, and then perpendicular to the flow of the coolant 10 through a portion of the coolant transmitter 910. In some embodiments, the coolant 10 can flow through a portion of the evaporation vessels 930 parallel to the flow of the coolant 10 through the coolant transmitter 910, and then perpendicular to the flow of the coolant 10 through a portion of the coolant transmitter 910. As shown, the evaporation vessel 930A is vented to atmospheric pressure or near atmospheric pressure. As shown, the flow of the coolant 10 through the evaporation vessel 930B is controlled by the throttle 941 and the level sensor 960. In some embodiments, the cooling system 900 can include multiple evaporation vessels vented to atmospheric pressure or near atmospheric pressure (e.g., evaporation vessel 930A). In some embodiments, the cooling system 900 can include 0, 1, 2, 3, 4, 5, 6, 7, 8, 9, 10, or more evaporation vessels vented to atmospheric pressure or near atmospheric pressure. In some embodiments, the cooling system 900 can include multiple evaporation vessels, through which coolant flow is controlled by a throttle and a level sensor (e.g., evaporation vessel 930B). In some embodiments, the cooling system 900 can include 0, 1, 2, 3, 4, 5, 6, 7, 8, 9, 10, or more evaporation vessels, through which coolant flow is controlled by a throttle and a level sensor.

Figure 10:
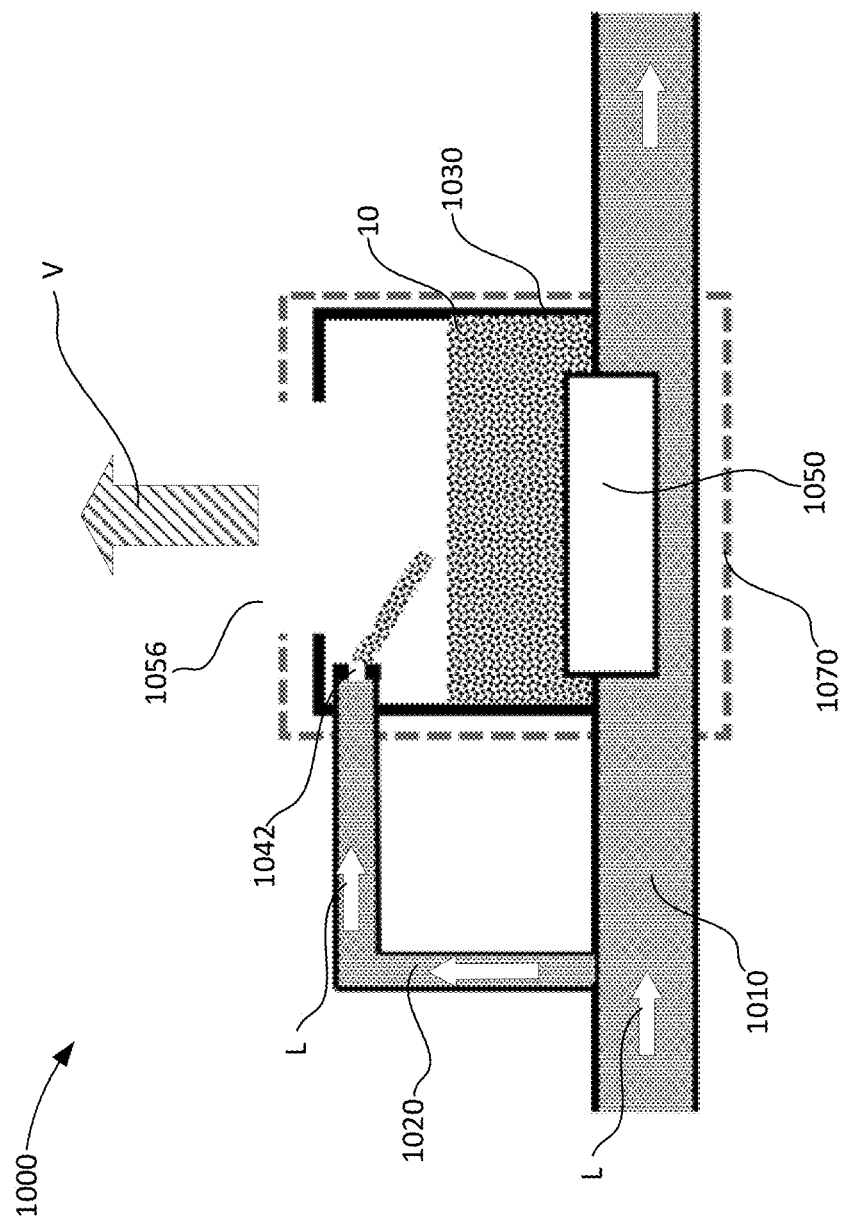
FIG. 10 illustrates a cooling system with an orifice and a heat exchanger, according to an embodiment.

FIG. 10 illustrates a cooling system 1000, according to an embodiment. As shown, the cooling system 1000 includes a coolant transmitter, an exit stream conduit 1020, an evaporation vessel 1030, an orifice 1042, a heat exchanger 1050, an exit vent 1056, and a TIJ 1070. In some embodiments, the coolant transmitter 1010, the exit stream conduit 1020, the evaporation vessel 1030, the orifice 1042, the heat exchanger 1050, the exit vent 1056, and the TIJ 1070 can be the same or substantially similar to the coolant transmitter 410, the exit stream conduit 420, the evaporation vessel 430, the orifice 442, the heat exchanger 450, the exit vent 456, and the TIJ 470, as described above with reference to FIG. 4. Thus, certain aspects of the coolant transmitter 1010, the exit stream conduit 1020, the evaporation vessel 1030, the orifice 1042, the heat exchanger 1050, and the TIJ 1070 are not described in greater detail herein. As shown, the coolant 10 flows as a liquid along liquid lines L and as a vapor along vapor lines V.

In some embodiments, the heat exchanger 1050 can be an integral part of the flow line of the coolant 10. In some embodiments, the heat exchanger 1050 can include a surface enhanced for forced convective heat transfer protruding into the flow path of the coolant 10. In some embodiments, the enhanced surface in the heat exchanger 1050 can include fins, fingers, or any other surface features to facilitate heat transfer. In some embodiments, the enhanced surface can include a base that is fixed to, or passes through, a pressure barrier, thus creating a strong thermal link with the coolant 10 in the evaporation vessel 1030.

Figure 11:
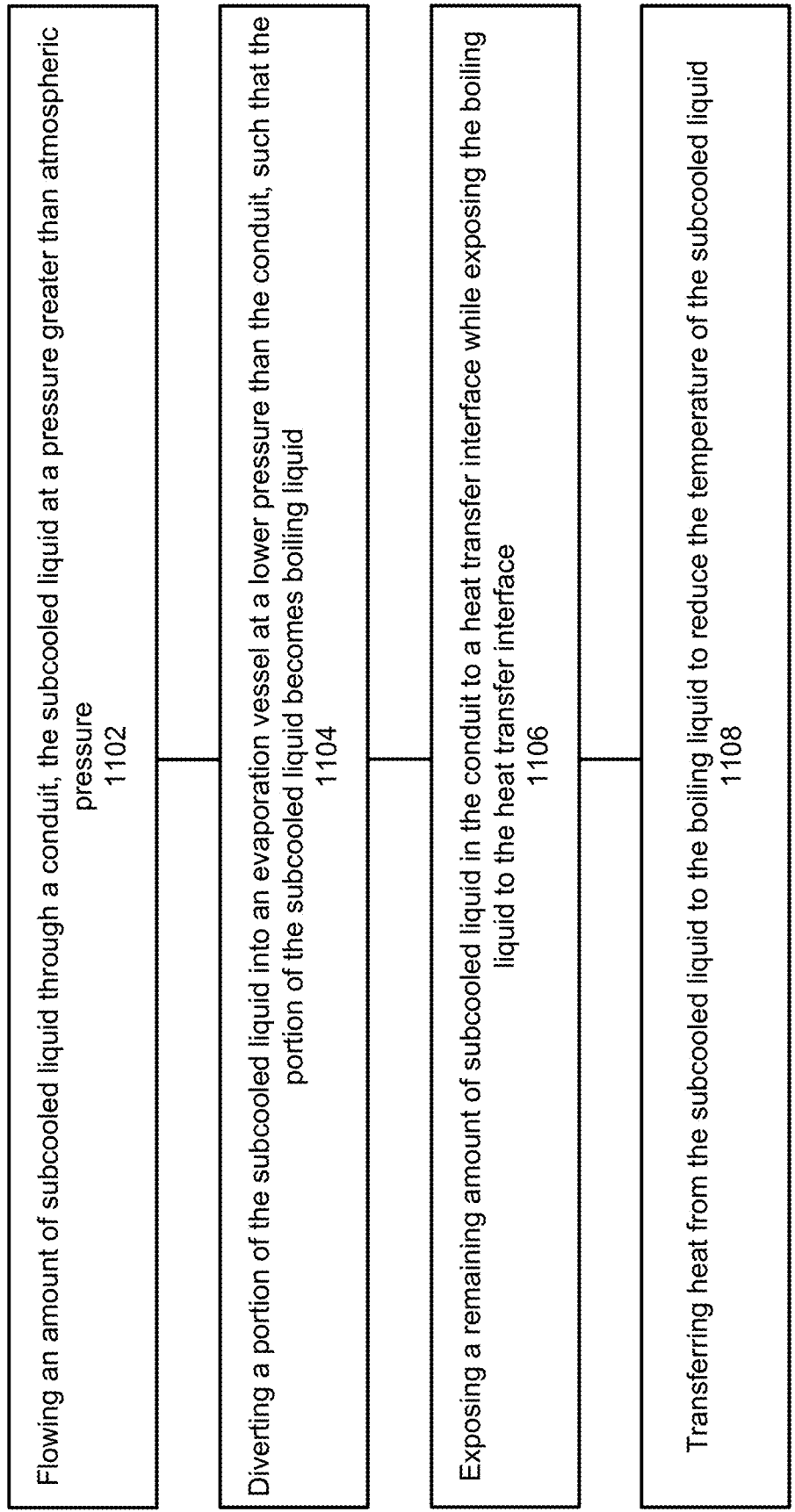
FIG. 11 is a diagram of a method of cooling a subcooled liquid, according to an embodiment.

FIG. 11 is a block diagram of a method 1100 of cooling a subcooled liquid, according to an embodiment. The method 1100 includes flowing an amount of subcooled liquid through a conduit, wherein the subcooled liquid is at a pressure greater than atmospheric pressure at step 1102. The method 1100 further includes diverting a portion of the subcooled liquid into an evaporation vessel, wherein the evaporation vessel is at a lower pressure than the conduit, such that the portion of the subcooled liquid becomes boiling liquid at step 1104. The method 1100 further includes exposing a remaining amount of subcooled liquid in the conduit to a heat transfer interface while exposing the boiling liquid to the heat transfer interface at step 1106 and transferring heat from the subcooled liquid to the boiling liquid to reduce the temperature of the subcooled liquid at step 1108.

In some embodiments, the subcooled liquid flowed through the conduit at step 1102 can include a coolant. In some embodiments, the subcooled liquid can include LN, liquid helium, liquid neon, liquid air, liquid hydrogen, liquid natural gas, or any combination thereof. In some embodiments, the subcooled liquid can flow through the conduit at a flow rate of at least about 10 L/min, at least about 20 L/min, at least about 30 L/min, at least about 40 L/min, at least about 50 L/min, at least about 60 L/min, at least about 70 L/min, at least about 80 L/min, at least about 90 L/min, at least about 100 L/min, at least about 200 L/min, at least about 300 L/min, at least about 400 L/min, at least about 500 L/min, at least about 600 L/min, at least about 700 L/min, at least about 800 L/min, at least about 900 L/min, at least about 1 m$^3$/min, at least about 2 m$^3$/min, at least about 3 m$^3$/min, at least about 4 m$^3$/min, at least about 5 m$^3$/min, at least about 6 m$^3$/min, at least about 7 m$^3$/min, at least about 8 m$^3$/min, or at least about 9 m$^3$/min. In some embodiments, the subcooled liquid can flow through the conduit at a flow rate of no more than about 10 m$^3$/min, no more than about 9 m$^3$/min, no more than about 8 m$^3$/min, no more than about 7 m$^3$/min, no more than about 6 m$^3$/min, no more than about 5 m$^3$/min, no more than about 4 m$^3$/min, no more than about 3 m$^3$/min, no more than about 2 m$^3$/min, no more than about 1 m$^3$/min, no more than about 900 L/min, no more than about 800 L/min, no more than about 700 L/min, no more than about 600 L/min, no more than about 500 L/min, no more than about 400 L/min, no more than about 300 L/min, no more than about 200 L/min, no more than about 100 L/min, no more than about 90 L/min, no more than about 80 L/min, no more than about 70 L/min, no more than about 60 L/min, no more than about 50 L/min, no more than about 40 L/min, no more than about 30 L/min, or no more than about 20 L/min. Combinations of the above-referenced ranges for the amount of the flow rate of the subcooled liquid through the conduit are also possible (e.g., at least about 20 L/min and no more than about 10 m$^3$/min or at least about 100 L/min and no more than about 500 L/min), inclusive of all values and ranges therebetween. In some embodiments, the flow rate of the subcooled liquid through the conduit can be about 9 L/min, about 10 L/min, about 20 L/min, about 30 L/min, about 40 L/min, about 50 L/min, about 60 L/min, about 70 L/min, about 80 L/min, about 90 L/min, about 100 L/min, about 200 L/min, about 300 L/min, about 400 L/min, about 500 L/min, about 600 L/min, about 700 L/min, about 800 L/min, about 900 L/min, about 1 m$^3$/min, about 2 m$^3$/min, about 3 m$^3$/min, about 4 m$^3$/min, about 5 m$^3$/min, about 6 m$^3$/min, about 7 m$^3$/min, about 8 m$^3$/min, about 9 m$^3$/min, or about 10 m$^3$/min.

In some embodiments, the subcooled liquid can be maintained at a gauge pressure of at least about 1 bar, at least about 2 bar, at least about 3 bar, at least about 4 bar, at least about 5 bar, at least about 6 bar, at least about 7 bar, at least about 8 bar, at least about 9 bar, at least about 10 bar, at least about 15 bar, at least about 20 bar, at least about 25 bar, at least about 30 bar, at least about 35 bar, at least about 40 bar, or at least about 45 bar. In some embodiments, the subcooled liquid can be maintained at a gauge pressure of no more than about 50 bar, no more than about 45 bar, no more than about 40 bar, no more than about 35 bar, no more than about 30 bar, no more than about 25 bar, no more than about 20 bar, no more than about 15 bar, no more than about 10 bar, no more than about 9 bar, no more than about 8 bar, no more than about 7 bar, no more than about 6 bar, no more than about 5 bar, no more than about 4 bar, no more than about 3 bar, or no more than about 2 bar. Combinations of the above-referenced gauge pressures of the subcooled liquid are also possible (e.g., at least about 1 bar and no more than about 50 bar or at least about 10 bar and no more than about 30 bar), inclusive of all values and ranges therebetween. In some embodiments, the subcooled liquid 110 can be maintained at a gauge pressure of about 1 bar, about 2 bar, about 3 bar, about 4 bar, about 5 bar, about 6 bar, about 7 bar, about 8 bar, about 9 bar, about 10 bar, about 15 bar, about 20 bar, about 25 bar, about 30 bar, about 35 bar, about 40 bar, about 45 bar, or about 50 bar. In some embodiments, the pressure of the subcooled liquid can be maintained via a pump, a booster pump, a compressor, a centrifugal pump, or any combination thereof.

In some embodiments, the weight percentage of the subcooled liquid diverted into the evaporation vessel at step 1104 can be at least about 0.5 wt %, at least about 1 wt %, at least about 1.5 wt %, at least about 2 wt %, at least about 2.5 wt %, at least about 3 wt %, at least about 3.5 wt %, at least about 4 wt %, at least about 4.5 wt %, at least about 5 wt %, at least about 5.5 wt %, at least about 6 wt %, at least about 6.5 wt %, at least about 7 wt %, at least about 7.5 wt %, at least about 8 wt %, at least about 8.5 wt %, at least about 9 wt %, or at least about 9.5 wt %. In some embodiments, the weight percentage of the subcooled liquid diverted into the evaporation vessel at step 1104 can be no more than about 10 wt %, no more than about 9.5 wt %, no more than about 9 wt %, no more than about 8.5 wt %, no more than about 8 wt %, no more than about 7.5 wt %, no more than about 7 wt %, no more than about 6.5 wt %, no more than about 6 wt %, no more than about 5.5 wt %, no more than about 5 wt %, no more than about 4.5 wt %, no more than about 4 wt %, no more than about 3.5 wt %, no more than about 3 wt %, no more than about 2.5 wt %, no more than about 2 wt %, no more than about 1.5 wt %, or no more than about 1 wt %. Combinations of the above-referenced ranges for the weight percentage of subcooled liquid diverted to the evaporation vessel at step 1104 are also possible (e.g., at least about 0.5 wt % and no more than about 10 wt % or at least about 1 wt % and no more than about 5 wt %), inclusive of all values and ranges therebetween. In some embodiments, the weight percentage of the subcooled liquid diverted to the evaporation vessel at step 1104 can be about 0.5 wt %, about 1 wt %, about 1.5 wt %, about 2 wt %, about 2.5 wt %, about 3 wt %, about 3.5 wt %, about 4 wt %, about 4.5 wt %, about 5 wt %, about 5.5 wt %, about 6 wt %, about 6.5 wt %, about 7 wt %, about 7.5 wt %, about 8 wt %, about 8.5 wt %, about 9 wt %, about 9.5 wt %, or about 10 wt %.

In some embodiments, the subcooled liquid can be diverted to the evaporation vessel at step 1104 at a rate of at least about 0.1 L/min, at least about 0.2 L/min, at least about 0.3 L/min, at least about 0.4 L/min, at least about 0.5 L/min, at least about 0.6 L/min, at least about 0.7 L/min, at least about 0.8 L/min, at least about 0.9 L/min, at least about 1 L/min, at least about 2 L/min, at least about 3 L/min, at least about 4 L/min, at least about 5 L/min, at least about 6 L/min, at least about 7 L/min, at least about 8 L/min, at least about 9 L/min, at least about 10 L/min, at least about 20 L/min, at least about 30 L/min, at least about 40 L/min, at least about 50 L/min, at least about 60 L/min, at least about 70 L/min, at least about 80 L/min, at least about 90 L/min, at least about 100 L/min, at least about 200 L/min, at least about 300 L/min, at least about 400 L/min, at least about 500 L/min, at least about 600 L/min, at least about 700 L/min, at least about 800 L/min, or at least about 900 L/min. In some embodiments, the subcooled liquid can be diverted to the evaporation vessel at step 1104 at a rate of no more than about 1,000 L/min, no more than about 900 L/min, no more than about 800 L/min, no more than about 700 L/min, no more than about 600 L/min, no more than about 500 L/min, no more than about 400 L/min, no more than about 300 L/min, no more than about 200 L/min, no more than about 100 L/min, no more than about 90 L/min, no more than about 80 L/min, no more than about 70 L/min, no more than about 60 L/min, no more than about 50 L/min, no more than about 40 L/min, no more than about 30 L/min, no more than about 20 L/min, no more than about 10 L/min, no more than about 9 L/min, no more than about 8 L/min, no more than about 7 L/min, no more than about 6 L/min, no more than about 5 L/min, no more than about 4 L/min, no more than about 3 L/min, no more than about 2 L/min, no more than about 1 L/min, no more than about 0.9 L/min, no more than about 0.8 L/min, no more than about 0.7 L/min, no more than about 0.6 L/min, no more than about 0.5 L/min, no more than about 0.4 L/min, no more than about 0.3 L/min, no more than about 0.2 L/min, or no more than about 0.1 L/min. Combinations of the above-referenced ranges for the amount of subcooled liquid diverted to the evaporation vessel at step 1104 are also possible (e.g., at least about 0.1 L/min and no more than about 1,000 L/min or at least about 10 L/min and no more than about 50 L/min), inclusive of all values and ranges therebetween. In some embodiments, the subcooled liquid can be diverted to the evaporation vessel at step 1104 at a rate of about 0.1 L/min, about 0.2 L/min, about 0.3 L/min, about 0.4 L/min, about 0.5 L/min, about 0.6 L/min, about 0.7 L/min, about 0.8 L/min, about 0.9 L/min, about 1 L/min, about 2 L/min, about 3 L/min, about 4 L/min, about 5 L/min, about 6 L/min, about 7 L/min, about 8 L/min, about 9 L/min, about 10 L/min, about 20 L/min, about 30 L/min, about 40 L/min, about 50 L/min, about 60 L/min, about 70 L/min, about 80 L/min, about 90 L/min, about 100 L/min, about 200 L/min, about 300 L/min, about 400 L/min, about 500 L/min, about 600 L/min, about 700 L/min, about 800 L/min, about 900 L/min, or about 1,000 L/min.

The subcooled liquid becomes boiling liquid in the evaporation vessel. In some embodiments, the evaporation vessel can be vented to atmospheric pressure or near atmospheric pressure. In some embodiments, vapor exits the evaporation vessel at or near atmospheric pressure and can be captured (e.g., for later use) and/or transported (e.g., to a further heat exchanger that warms the vapor to an ambient temperature prior to venting).

In some embodiments, step 1106 can include passing the remaining subcooled liquid through a first side of a heat exchanger while passing the boiling liquid through a second side of the heat exchanger, the second side opposite the first side. In some embodiments, forced convective heat transfer can occur at step 1108. In some embodiments, conductive heat transfer can occur at step 1108. In some embodiments, forced convective heat transfer can occur via flow of the subcooled liquid and the boiling liquid. In some embodiments, conductive heat transfer can occur via walls of the heat exchanger or heat exchange interface.

In some embodiments, the heat transfer from the boiling liquid to the subcooled liquid at step 1108 can reduce the temperature of the subcooled liquid by at least about 0.1 K, at least about 0.2 K, at least about 0.3 K, at least about 0.4 K, at least about 0.5 K, at least about 0.6 K, at least about 0.7 K, at least about 0.8 K, at least about 0.9 K, at least about 1 K, at least about 2 K, at least about 3 K, at least about 4 K, at least about 5 K, at least about 6 K, at least about 7 K, at least about 8 K, or at least about 9 K. In some embodiments, the heat transfer from the boiling liquid to the subcooled liquid at step 1108 can reduce the temperature of the subcooled liquid by no more than about 10 K, no more than about 9 K, no more than about 8 K, no more than about 7 K, no more than about 6 K, no more than about 5 K, no more than about 4 K, no more than about 3 K, no more than about 2 K, no more than about 1 K, no more than about 0.9 K, no more than about 0.8 K, no more than about 0.7 K, no more than about 0.6 K, no more than about 0.5 K, no more than about 0.4 K, no more than about 0.3 K, or no more than about 0.2 K. Combinations of the above-referenced reductions in temperature of the subcooled liquid are also possible (e.g., at least about 0.1 K and no more than about 10 K or at least about 1 K and no more than about 5 K), inclusive of all values and ranges therebetween. In some embodiments, the heat transfer from the boiling liquid to the subcooled liquid at step 1108 can reduce the temperature of the subcooled liquid by about 0.1 K, about 0.2 K, about 0.3 K, about 0.4 K, about 0.5 K, about 0.6 K, about 0.7 K, about 0.8 K, about 0.9 K, about 1 K, about 2 K, about 3 K, about 4 K, about 5 K, about 6 K, about 7 K, about 8 K, or about 9 K.

In some embodiments, a cooling system includes a coolant transmitter that transmits a coolant at a pressure greater than atmospheric pressure. The cooling system further includes an evaporation vessel that contains an amount of the coolant at a boiling point of the coolant and a pressure regulator or pressure reducer at an interface. The interface is fluidically coupled to the coolant transmitter and the evaporation vessel. The coolant contained in the evaporation vessel absorbs heat from the coolant in the coolant transmitter.

In some embodiments, the cooling system can further include an exit stream conduit fluidically coupled to the coolant transmitter and the pressure regulator or pressure reducer. The exit stream conduit can divert a portion of the coolant from the coolant transmitter to the evaporation vessel.

In some embodiments, a level sensor can be disposed in the evaporation vessel. In some embodiments, the level sensor can be a ball float level sensor physically coupled to the pressure regulator or pressure reducer.

In some embodiments, the pressure regulator can include a throttle and/or an orifice.

In some embodiments, the cooling system can include a heat exchanger. The heat exchanger can be fluidically coupled to the coolant transmitter and in physical contact with the evaporation vessel, the heat exchanger configured to circulate coolant from the coolant transmitter and back to the coolant transmitter such that heat can transfer from the coolant in the heat exchanger to the boiling coolant in the evaporation vessel.

In some embodiments, the coolant can include liquid nitrogen, liquid hydrogen, liquid natural gas, another cryogen (e.g., cryogenic fluid) or coolant, or any combination thereof.

In some embodiments, the evaporation vessel is a heat exchanger at least partially disposed in the coolant transmitter.

In some embodiments, the coolant transmitter can include a first portion and a second portion, with the first portion and the second portion fluidically coupled via a heat exchanger. In some embodiments, the heat exchanger can be at least partially submersed in boiling coolant. In some embodiments, the heat exchanger can include a spiral tube heat exchanger.

In some embodiments, a cooling system includes a coolant transmitter that transmits a subcooled liquid at a pressure greater than atmospheric pressure, the subcooled liquid exposed to a first side of a heat exchange interface. The cooling system further includes an exit stream conduit that diverts a portion of the subcooled liquid from the coolant transmitter to an evaporation vessel. The cooling system also includes a pressure regulator at a fluidic interface between the exit stream conduit and the evaporation vessel. The pressure regulator maintains a pressure difference between the exit stream conduit and the evaporation vessel. The evaporation vessel is configured to contain an amount of boiling liquid at a pressure lower than the coolant transmitter, the boiling liquid exposed to a second side of the heat exchange interface and configured to absorb heat from the subcooled liquid.

In some embodiments, the subcooled liquid and the boiling liquid include a coolant. In some embodiments, the coolant can include liquid nitrogen, liquid hydrogen, liquid natural gas, another cryogen (e.g., cryogenic fluid) or coolant, or any combination thereof.

In some embodiments, the pressure regulator can include a throttle. In some embodiments, the pressure regulator can include an orifice.

In some embodiments, the first side of the heat exchange interface can be a shell side of a shell and tube heat exchanger and the second side of the heat exchange interface can be a tube side of the shell and tube heat exchanger.

In some embodiments, the coolant transmitter can include a first portion and a second portion fluidically coupled by a spiral tube heat exchanger.

In some embodiments, a method of cooling a subcooled liquid can include flowing an amount of the subcooled liquid through a conduit, the subcooled liquid at a pressure greater than atmospheric pressure. The method further includes diverting a portion of the subcooled liquid into an evaporation vessel, the evaporation vessel at a lower pressure than the conduit, such that the portion of the subcooled liquid becomes boiling liquid. The method also includes exposing a remaining amount of subcooled liquid in the conduit to a heat transfer interface while exposing the boiling liquid to the heat transfer interface and transferring heat from the subcooled liquid to the boiling liquid to reduce the temperature of the subcooled liquid.

In some embodiments, the subcooled liquid and the boiling liquid can include a coolant. In some embodiments, the coolant can include liquid nitrogen, liquid hydrogen, liquid natural gas, another cryogen (e.g., cryogenic fluid) or coolant, or any combination thereof.

In some embodiments, cooling systems described herein can be configured for the flow of subcooled cryogen coolant in superconducting power lines. In some embodiments, a portion of the subcooled cryogen can be extracted and allowed to vaporize under atmospheric pressure. In some embodiments, the latent heat of vaporization of the portion of the subcooled cryogen can cool the remaining subcooled cryogen to a lower temperature above the boiling temperature of the remaining subcooled cryogen.

In some embodiments, the subcooled cryogen coolant can be removed from the transmission line and passed to a heat exchanger. In some embodiments, the heat exchanger can be immersed in a bath of the portion of the subcooled cryogen coolant extracted and allowed to vaporize under atmospheric pressure.

In some embodiments, a level of the portion of the subcooled cryogen coolant can be controlled by means of a level sensor and a valve. In some embodiments, the portion of the subcooled cryogen coolant can flow through a defined flow impedance to maintain the bath at a desired level or temperature.

In some embodiments, the heat exchanger can be immersed in the flowing subcooled cryogen coolant and the heat exchanger can be cooled by admission of the subcooled cryogen coolant. In some embodiments, the admitted cryogen coolant can boil under atmospheric pressure within the heat exchanger and cool the flowing subcooled cryogen coolant around the heat exchanger.

In some embodiments, the volume of admitted cryogen coolant to the heat exchanger can be controlled by means of a level sensor and a valve.

In some embodiments, the admitted cryogen coolant can flow through a defined flow impedance to maintain the heat exchanger cryogen liquid coolant at a desired level or temperature.

In some embodiments, a subcooled flowing cryogen coolant can pass through a heat exchanger cooled by a spray of extracted cryogen coolant boiling at or near atmospheric pressure.

In some embodiments, the extracted cryogen coolant can flow through a defined flow impedance to maintain the bath at a desired cryogen liquid coolant level or temperature.

In some embodiments, cooling systems described herein can be configured to extract a portion of a subcooled cryogen coolant and allow the portion of the subcooled cryogen coolant to vaporize under a controlled pressure. In some embodiments, latent heat of vaporization of the portion of the cryogen coolant can be used to cool the remaining cryogen coolant to a temperature above the boiling temperature of the cryogen at the controlled pressure. In some embodiments, the controlled pressure can be below, equal to, or above the local atmospheric pressure. In some embodiments, the vaporized cryogen coolant can be allowed to vent to the atmosphere.

In some embodiments, cooling systems described herein can be configured to extract a portion of a subcooled cryogen coolant and allow the portion of the subcooled cryogen coolant to vaporize under a controlled pressure. In some embodiments, a latent heat of vaporization can be used to cool the remaining cryogen coolant to a temperature above the boiling temperature of the cryogen at the controlled pressure. In some embodiments, the controlled pressure can be below, equal to, or above the local atmospheric pressure. In some embodiments, the vaporized cryogen can be captured for further use.

All combinations of the foregoing concepts and additional concepts discussed herewithin (provided such concepts are not mutually inconsistent) are contemplated as being part of the subject matter disclosed herein. The terminology explicitly employed herein that also may appear in any disclosure incorporated by reference should be accorded a meaning most consistent with the particular concepts disclosed herein.

The drawings are primarily for illustrative purposes, and are not intended to limit the scope of the subject matter described herein. The drawings are not necessarily to scale; in some instances, various aspects of the subject matter disclosed herein may be shown exaggerated or enlarged in the drawings to facilitate an understanding of different features. In the drawings, like reference characters generally refer to like features (e.g., functionally similar and/or structurally similar elements).

The entirety of this application (including the Cover Page, Title, Headings, Background, Summary, Brief Description of the Drawings, Detailed Description, Embodiments, Abstract, Figures, Appendices, and otherwise) shows, by way of illustration, various embodiments in which the embodiments may be practiced. The advantages and features of the application are of a representative sample of embodiments only, and are not exhaustive and/or exclusive. Rather, they are presented to assist in understanding and teach the embodiments, and are not representative of all embodiments. As such, certain aspects of the disclosure have not been discussed herein. That alternate embodiments may not have been presented for a specific portion of the innovations or that further undescribed alternate embodiments may be available for a portion is not to be considered to exclude such alternate embodiments from the scope of the disclosure. It will be appreciated that many of those undescribed embodiments incorporate the same principles of the innovations and others are equivalent. Thus, it is to be understood that other embodiments may be utilized and functional, logical, operational, organizational, structural and/or topological modifications may be made without departing from the scope and/or spirit of the disclosure. As such, all examples and/or embodiments are deemed to be non-limiting throughout this disclosure.

Also, no inference should be drawn regarding those embodiments discussed herein relative to those not discussed herein other than it is as such for purposes of reducing space and repetition. For instance, it is to be understood that the logical and/or topological structure of any combination of any program components (a component collection), other components and/or any present feature sets as described in the figures and/or throughout are not limited to a fixed operating order and/or arrangement, but rather, any disclosed order is exemplary and all equivalents, regardless of order, are contemplated by the disclosure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

Various concepts may be embodied as one or more methods, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. As such, some of these features may be mutually contradictory, in that they cannot be simultaneously present in a single embodiment. Similarly, some features are applicable to one aspect of the innovations, and inapplicable to others.

In addition, the disclosure may include other innovations not presently described. Applicant reserves all rights in such innovations, including the right to embodiment such innovations, file additional applications, continuations, continuations-in-part, divisionals, and/or the like thereof. As such, it should be understood that advantages, embodiments, examples, functional, features, logical, operational, organizational, structural, topological, and/or other aspects of the disclosure are not to be considered limitations on the disclosure as defined by the embodiments or limitations on equivalents to the embodiments. Depending on the particular desires and/or characteristics of an individual and/or enterprise user, database configuration and/or relational model, data type, data transmission and/or network framework, syntax structure, and/or the like, various embodiments of the technology disclosed herein may be implemented in a manner that enables a great deal of flexibility and customization as described herein.

All definitions, as defined and used herein, should be understood to control over dictionary definitions, definitions in documents incorporated by reference, and/or ordinary meanings of the defined terms.

As used herein, in particular embodiments, the terms "about" or "approximately" when preceding a numerical value indicates the value plus or minus a range of 10%. Where a range of values is provided, it is understood that each intervening value, to the tenth of the unit of the lower limit unless the context clearly dictates otherwise, between the upper and lower limit of that range and any other stated or intervening value in that stated range is encompassed within the disclosure. That the upper and lower limits of these smaller ranges can independently be included in the smaller ranges is also encompassed within the disclosure, subject to any specifically excluded limit in the stated range. Where the stated range includes one or both of the limits, ranges excluding either or both of those included limits are also included in the disclosure.

The indefinite articles "a" and "an," as used herein in the specification and in the embodiments, unless clearly indicated to the contrary, should be understood to mean "at least one."

The phrase "and/or," as used herein in the specification and in the embodiments, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the embodiments, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the embodiments, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of" "only one of," or "exactly one of" "Consisting essentially of," when used in the embodiments, shall have its ordinary meaning as used in the field of patent law.

As used herein in the specification and in the embodiments, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the embodiments, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A cooling system, comprising:
   a coolant transmitter configured to transmit a coolant at a pressure greater than atmospheric pressure;
   an evaporation vessel at atmospheric pressure, the evaporation vessel including a level sensor and configured to contain an amount of the coolant at a boiling point of the coolant; and
   a pressure reducer fluidically coupled to the coolant transmitter and the evaporation vessel,
   wherein the cooling system is configured such that heat is transferred from the coolant in the coolant transmitter to the coolant contained in the evaporation vessel.

2. The cooling system of claim 1, further comprising an exit stream conduit fluidically coupled to the coolant transmitter and the pressure reducer, the exit stream conduit configured to divert a portion of the coolant from the coolant transmitter to the evaporation vessel.

3. The cooling system of claim 1, wherein the level sensor is a ball float level sensor physically coupled to the pressure reducer.

4. The cooling system of claim 1, wherein the pressure reducer includes a throttle.

5. The cooling system of claim 1, wherein the pressure reducer includes an orifice.

6. The cooling system of claim 1, further comprising a heat exchanger, the heat exchanger fluidically coupled to the coolant transmitter and in physical contact with the evaporation vessel, the heat exchanger configured to circulate coolant from the coolant transmitter and back to the coolant transmitter such that heat can transfer from the coolant in the heat exchanger to the boiling coolant in the evaporation vessel.

7. The cooling system of claim 1, wherein the coolant includes one of liquid nitrogen, liquid hydrogen, liquid natural gas, or a combination thereof.

8. The cooling system of claim 1, wherein the evaporation vessel is a heat exchanger at least partially disposed in the coolant transmitter.

9. The cooling system of claim 8, wherein the heat exchanger is at least partially submersed in boiling coolant.

10. The cooling system of claim 8, wherein the heat exchanger includes a spiral tube heat exchanger.

11. The cooling system of claim 1, wherein the coolant transmitter includes a first portion and a second portion, the first portion and the second portion fluidically coupled via a heat exchanger.

12. The cooling system of claim 1, further comprising a thermally insulated jacket disposed around the outside of the evaporation vessel.

13. The cooling system of claim 1, further comprising:
    a power transmission line in contact with the coolant transmitter.

14. A cooling system, comprising:
    a coolant transmitter configured to transmit a coolant at a pressure greater than atmospheric pressure;
    an evaporation vessel at atmospheric pressure at least partially disposed in the coolant transmitter, the evaporation vessel including a heat exchanger and configured to contain an amount of the coolant at a boiling point of the coolant; and a pressure reducer fluidically coupled to the coolant transmitter and the evaporation vessel, wherein the cooling system is configured such that heat is transferred from the coolant in the coolant transmitter to the coolant contained in the evaporation vessel.

15. The cooling system of claim 14, further comprising an exit stream conduit fluidically coupled to the coolant transmitter and the pressure reducer, the exit stream conduit configured to divert a portion of the coolant from the coolant transmitter to the evaporation vessel.

16. The cooling system of claim 14, wherein the level sensor is a ball float level sensor physically coupled to the pressure reducer.

17. The cooling system of claim 14, wherein the pressure reducer includes a throttle.

18. The cooling system of claim 14, wherein the pressure reducer includes an orifice.

19. The cooling system of claim 14, wherein the heat exchanger is fluidically coupled to the coolant transmitter and in physical contact with the evaporation vessel, the heat exchanger configured to circulate coolant from the coolant transmitter and back to the coolant transmitter such that heat can transfer from the coolant in the heat exchanger to the boiling coolant in the evaporation vessel.

20. The cooling system of claim 14, wherein the coolant includes one of liquid nitrogen, liquid hydrogen, liquid natural gas, or a combination thereof.

21. The cooling system of claim 14, wherein the coolant transmitter includes a first portion and a second portion, the first portion and the second portion fluidically coupled via the heat exchanger.

22. The cooling system of claim 14, wherein the heat exchanger is at least partially submersed in boiling coolant.

23. The cooling system of claim 14, wherein the heat exchanger includes a spiral tube heat exchanger.

24. The cooling system of claim 14, further comprising a thermally insulated jacket disposed around the outside of the evaporation vessel.

25. The cooling system of claim 14, further comprising:
a power transmission line in contact with the coolant transmitter.

26. A cooling system, comprising:
a coolant transmitter configured to transmit a coolant at a pressure greater than atmospheric pressure;
an evaporation vessel at atmospheric pressure, the evaporation vessel configured to contain an amount of the coolant at a boiling point of the coolant;
a thermally insulated jacket disposed around the outside of the evaporation vessel; and
a pressure reducer fluidically coupled to the coolant transmitter and the evaporation vessel,
wherein the cooling system is configured such that heat is transferred from the coolant in the coolant transmitter to the coolant contained in the evaporation vessel.

27. The cooling system of claim 26, further comprising an exit stream conduit fluidically coupled to the coolant transmitter and the pressure reducer, the exit stream conduit configured to divert a portion of the coolant from the coolant transmitter to the evaporation vessel.

28. The cooling system of claim 26, wherein the level sensor is a ball float level sensor physically coupled to the pressure reducer.

29. The cooling system of claim 26, wherein the pressure reducer includes a throttle.

30. The cooling system of claim 26, wherein the pressure reducer includes an orifice.

31. The cooling system of claim 26, further comprising a heat exchanger, the heat exchanger fluidically coupled to the coolant transmitter and in physical contact with the evaporation vessel, the heat exchanger configured to circulate coolant from the coolant transmitter and back to the coolant transmitter such that heat can transfer from the coolant in the heat exchanger to the boiling coolant in the evaporation vessel.

32. The cooling system of claim 26, wherein the coolant includes one of liquid nitrogen, liquid hydrogen, liquid natural gas, or a combination thereof.

33. The cooling system of claim 26, wherein the coolant transmitter includes a first portion and a second portion, the first portion and the second portion fluidically coupled via a heat exchanger.

34. The cooling system of claim 26, wherein the evaporation vessel is a heat exchanger at least partially disposed in the coolant transmitter and the heat exchanger is at least partially submersed in boiling coolant.

35. The cooling system of claim 26, wherein the evaporation vessel is a heat exchanger at least partially disposed in the coolant transmitter and the heat exchanger includes a spiral tube heat exchanger.

36. The cooling system of claim 26, further comprising:
a power transmission line in contact with the coolant transmitter.

* * * * *